(12) United States Patent
Feng et al.

(10) Patent No.: US 11,361,693 B2
(45) Date of Patent: Jun. 14, 2022

(54) SHIFT REGISTER UNIT, GATE DRIVING CIRCUIT, DISPLAY DEVICE, AND DRIVING METHOD

(71) Applicants: Hefei Xinsheng Optoelectronics Technology Co., Ltd., Anhui (CN); BOE Technology Group Co., Ltd., Beijing (CN)

(72) Inventors: Xuehuan Feng, Beijing (CN); Yongqian Li, Beijing (CN)

(73) Assignees: Hefei Xinsheng Optoelectronics Technology Co., Ltd., Hefei (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/633,965

(22) PCT Filed: Jul. 10, 2019

(86) PCT No.: PCT/CN2019/095480
§ 371 (c)(1),
(2) Date: Jan. 24, 2020

(87) PCT Pub. No.: WO2020/029741
PCT Pub. Date: Feb. 13, 2020

(65) Prior Publication Data
US 2021/0082328 A1 Mar. 18, 2021

(30) Foreign Application Priority Data
Aug. 8, 2018 (CN) .......................... 201810898493.3

(51) Int. Cl.
*G09G 3/20* (2006.01)
*G11C 19/28* (2006.01)

(52) U.S. Cl.
CPC ............. *G09G 3/20* (2013.01); *G11C 19/287* (2013.01); *G09G 2300/0426* (2013.01);
(Continued)

(58) Field of Classification Search
CPC ............. G09G 3/20; G09G 2300/0426; G09G 2310/061; G09G 2310/0286; G09G 2310/08; G11C 19/287
See application file for complete search history.

(56) References Cited

U.S. PATENT DOCUMENTS 8,422,621 B2 * 4/2013 Jang .................. G11C 19/00
377/64
10,181,279 B2 * 1/2019 Shim ................. G09G 3/3266
(Continued)

FOREIGN PATENT DOCUMENTS

| CN | 102760406 A | 10/2012 |
|---|---|---|
| CN | 104575429 A | 4/2015 |

(Continued)

OTHER PUBLICATIONS

Apr. 4, 2022—(EP) Extended European Search Report Appn 19832534.2.

*Primary Examiner* — Grant Sitta
(74) *Attorney, Agent, or Firm* — Banner & Witcoff, Ltd.

(57) ABSTRACT

A shift register unit, a gate driving circuit, a display device, and a driving method are provided. The shift register unit includes a first input circuit, an output control circuit, and an output circuit. The first input circuit is configured to output a first input signal to a first node in response to a first control signal; the output control circuit is configured to output an output control signal to a second node under control of a level of the first node; and the output circuit includes an
(Continued)

output terminal, and the output circuit is configured to output an output signal to the output terminal under control of a level of the second node.

16 Claims, 8 Drawing Sheets

(52) U.S. Cl.
CPC ............ *G09G 2310/0286* (2013.01); *G09G 2310/061* (2013.01); *G09G 2310/08* (2013.01)

(56) References Cited

U.S. PATENT DOCUMENTS

| | | | |
|---|---|---|---|
| 10,217,428 B2* | 2/2019 | Fan | G11C 19/28 |
| 10,236,073 B2* | 3/2019 | Feng | G11C 19/28 |
| 10,593,286 B2* | 3/2020 | Wu | G09G 3/20 |
| 10,937,516 B2 | 3/2021 | Tao et al. | |
| 11,127,326 B2* | 9/2021 | Feng | G11C 19/28 |
| 2008/0101529 A1* | 5/2008 | Tobita | G11C 19/28 |
| | | | 377/64 |
| 2012/0139883 A1* | 6/2012 | Lee | G09G 3/3677 |
| | | | 345/204 |
| 2012/0182279 A1* | 7/2012 | Ochiai | G09G 3/3677 |
| | | | 345/209 |
| 2012/0269315 A1 | 10/2012 | Jang et al. | |
| 2013/0027378 A1* | 1/2013 | Lee | G09G 3/3677 |
| | | | 345/212 |
| 2013/0077736 A1* | 3/2013 | Son | G09G 3/20 |
| | | | 377/69 |
| 2014/0198022 A1* | 7/2014 | Chou | G09G 3/3677 |
| | | | 345/92 |
| 2015/0213762 A1* | 7/2015 | Xia | G09G 3/3266 |
| | | | 345/215 |
| 2016/0155422 A1* | 6/2016 | Sun | G11C 19/287 |
| | | | 345/213 |
| 2016/0187917 A1* | 6/2016 | Lou | G09G 3/3677 |
| | | | 345/213 |
| 2016/0225336 A1 | 8/2016 | Gu et al. | |
| 2016/0351110 A1* | 12/2016 | Jin | G09G 3/20 |
| 2017/0108989 A1* | 4/2017 | Gu | G06F 3/04184 |
| 2017/0193957 A1* | 7/2017 | Liu | G11C 19/28 |
| 2018/0197455 A1 | 7/2018 | Han et al. | |
| 2019/0013083 A1 | 1/2019 | Wang et al. | |
| 2019/0206294 A1 | 7/2019 | Tian et al. | |
| 2020/0193925 A1* | 6/2020 | Takahashi | G09G 3/3674 |

FOREIGN PATENT DOCUMENTS

| | | |
|---|---|---|
| CN | 108154835 A | 6/2018 |
| CN | 108320708 A | 7/2018 |
| CN | 108682398 A | 10/2018 |
| KR | 20150078981 A | 7/2015 |
| WO | 2018040768 A1 | 3/2018 |

* cited by examiner

SHIFT REGISTER UNIT, GATE DRIVING CIRCUIT, DISPLAY DEVICE, AND DRIVING METHOD

The application is a U.S. National Phase Entry of International Application No. PCT/CN2019/095480 filed on Jul. 10, 2019, designating the United States of America and claiming priority to Chinese Patent Application No. 201810898493.3, filed on Aug. 8, 2018. The present application claims priority to and the benefit of the above-identified applications and the above-identified applications are incorporated by reference herein in their entirety.

TECHNICAL FIELD

The embodiments of the present disclosure relate to a shift register unit, a gate driving circuit, a display device, and a driving method.

BACKGROUND

In a field of display technology, for example, a pixel array of a liquid crystal display panel or an organic light emitting diode (OLED) display panel generally comprises a plurality of rows of gate lines and a plurality of columns of data lines interleaved with the plurality of rows of gate lines. The gate lines can be driven by a gate driving circuit. The gate driving circuit is usually integrated in a gate driving chip (Gate IC).

SUMMARY

At least one embodiment of the present disclosure provides a shift register unit, and the shift register unit comprises a first input circuit, an output control circuit, and an output circuit. The first input circuit is configured to output a first input signal to a first node in response to a first control signal; the output control circuit is configured to output an output control signal to a second node under control of a level of the first node; and the output circuit comprises an output terminal, and the output circuit is configured to output an output signal to the output terminal under control of a level of the second node.

For example, in the shift register unit provided by an embodiment of the present disclosure, the first input circuit is connected to the first node, the output control circuit is connected to the first node and the second node, and the output circuit is connected to the second node.

For example, in the shift register unit provided by an embodiment of the present disclosure, the output terminal comprises a shift output terminal and at least one scan signal output terminal.

For example, the shift register unit provided by an embodiment of the present disclosure further comprises a third node control circuit. The third node control circuit is connected to the first node and a third node, and is configured to control a level of the third node under control of the level of the first node.

For example, the shift register unit provided by an embodiment of the present disclosure further comprises a first noise reduction circuit. The first noise reduction circuit is connected to the first node, the second node, and the third node, and is configured to perform noise reduction on the first node and the second node under control of the level of the third node.

For example, the shift register unit provided by an embodiment of the present disclosure further comprises a fourth node control circuit. The fourth node control circuit is connected to the second node and a fourth node, and is configured to control a level of the fourth node under control of the level of the second node.

For example, the shift register unit provided by an embodiment of the present disclosure further comprises a second noise reduction circuit. The second noise reduction circuit is connected to the second node, the fourth node, and the output terminal, and is configured to perform noise reduction on the second node and the output terminal under control of the level of the fourth node.

For example, in the shift register unit provided by an embodiment of the present disclosure, the first input circuit comprises a first transistor, a gate electrode of the first transistor is connected to a display control terminal to receive the first control signal, a first electrode of the first transistor is connected to a first voltage terminal to receive a first voltage as the first input signal, and a second electrode of the first transistor is connected to the first node.

For example, in the shift register unit provided by an embodiment of the present disclosure, the third node control circuit comprises a second transistor, a third transistor, and a fourth transistor; a gate electrode and a first electrode of the second transistor are connected to each other, and are connected to a first clock signal terminal to receive a first clock signal, and a second electrode of the second transistor is connected to the third node; a gate electrode and a first electrode of the third transistor are connected to each other, and are connected to a second clock signal terminal to receive a second clock signal, and a second electrode of the third transistor is connected to the third node; and a gate electrode of the fourth transistor is connected to the first node, a first electrode of the fourth transistor is connected to the third node, and a second electrode of the fourth transistor is connected to a second voltage terminal to receive a second voltage.

For example, in the shift register unit provided by an embodiment of the present disclosure, the first noise reduction circuit comprises a fifth transistor and a sixth transistor. A gate electrode of the fifth transistor is connected to the third node, a first electrode of the fifth transistor is connected to the first node, and a second electrode of the fifth transistor is connected to a second voltage terminal to receive a second voltage; and a gate electrode of the sixth transistor is connected to the third node, a first electrode of the sixth transistor is connected to the second node, and a second electrode of the sixth transistor is connected to the second voltage terminal to receive the second voltage.

For example, in the shift register unit provided by an embodiment of the present disclosure, the output control circuit comprises a seventh transistor and a first capacitor; a gate electrode of the seventh transistor is connected to the first node, a first electrode of the seventh transistor is connected to a third clock signal terminal to receive a third clock signal as the output control signal, and a second electrode of the seventh transistor is connected to the second node; and a first terminal of the first capacitor is connected to the first node, and a second terminal of the first capacitor is connected to the second node.

For example, in the shift register unit provided by an embodiment of the present disclosure, the fourth node control circuit comprises an eighth transistor, a ninth transistor, and a tenth transistor; a gate electrode and a first electrode of the eighth transistor are connected to each other, and are connected to a first clock signal terminal to receive a first clock signal, and a second electrode of the eighth transistor is connected to the fourth node; a gate electrode and a first electrode of the ninth transistor are connected to each other, and are connected to a second clock signal terminal to receive a second clock signal, and a second electrode of the ninth transistor is connected to the fourth node; and a gate electrode of the tenth transistor is connected to the second node, a first electrode of the tenth transistor is connected to the fourth node, and a second electrode of the tenth transistor is connected to a second voltage terminal to receive a second voltage.

For example, in the shift register unit provided by an embodiment of the present disclosure, the at least one scan signal output terminal comprises a first scan signal output terminal and a second scan signal output terminal, and the second noise reduction circuit comprises an eleventh transistor, a twelfth transistor, a thirteenth transistor, and a fourteenth transistor. A gate electrode of the eleventh transistor is connected to the fourth node, a first electrode of the eleventh transistor is connected to the second node, and a second electrode of the eleventh transistor is connected to a second voltage terminal to receive a second voltage; a gate electrode of the twelfth transistor is connected to the fourth node, a first electrode of the twelfth transistor is connected to the shift output terminal, and a second electrode of the twelfth transistor is connected to the second voltage terminal to receive the second voltage; a gate electrode of the thirteenth transistor is connected to the fourth node, a first electrode of the thirteenth transistor is connected to the first scan signal output terminal, and a second electrode of the thirteenth transistor is connected to a third voltage terminal to receive a third voltage; and a gate electrode of the fourteenth transistor is connected to the fourth node, a first electrode of the fourteenth transistor is connected to the second scan signal output terminal, and a second electrode of the fourteenth transistor is connected to the third voltage terminal to receive the third voltage.

For example, in the shift register unit provided by an embodiment of the present disclosure, the output circuit comprises a fifteenth transistor, a sixteenth transistor, a seventeenth transistor, and a second capacitor. A gate electrode of the fifteenth transistor is connected to the second node, a first electrode of the fifteenth transistor is connected to a fourth clock signal terminal to receive a fourth clock signal as the output signal, and a second electrode of the fifteenth transistor is connected to the shift output terminal; a gate electrode of the sixteenth transistor is connected to the second node, and a first electrode of the sixteenth transistor is connected to the fourth clock signal terminal to receive the fourth clock signal as the output signal, and a second electrode of the sixteenth transistor is connected to the first scan signal output terminal; a gate electrode of the seventeenth transistor is connected to the second node, and a first electrode of the seventeenth transistor is connected to a fifth clock signal terminal to receive a fifth clock signal as the output signal, and a second electrode of the seventeenth transistor is connected to the second scan signal output terminal; and a first terminal of the second capacitor is connected to the second node, and a second terminal of the second capacitor is connected to the shift output terminal.

For example, the shift register unit provided by an embodiment of the present disclosure further comprises a second input circuit. The second input circuit is connected to the first node and is configured to input a second input signal to the first node according to a second control signal.

For example, in the shift register unit provided by an embodiment of the present disclosure, the second input circuit comprises a charging sub-circuit, a storage sub-circuit, and an isolation sub-circuit; the charging sub-circuit is connected to a blanking node, and is configured to input the second control signal to the blanking node in response to a sixth clock signal; the storage sub-circuit is connected to the blanking node, and is configured to store a level of the second control signal input by the charging sub-circuit; and the isolation sub-circuit is connected to the blanking node and the first node, and is configured to input the second input signal to the first node under control of a level of the blanking node and a seventh clock signal.

For example, in the shift register unit provided by an embodiment of the present disclosure, the charging sub-circuit comprises an eighteenth transistor, a gate electrode of the eighteenth transistor is connected to a sixth clock signal terminal to receive the sixth clock signal, a first electrode of the eighteenth transistor is connected to a blanking control terminal to receive the second control signal, and a second electrode of the eighteenth transistor is connected to the blanking node; the storage sub-circuit comprises a third capacitor, a first terminal of the third capacitor is connected to the blanking node, and a second terminal of the third capacitor is connected to a second voltage terminal to receive a second voltage; and the isolation sub-circuit comprises a nineteenth transistor and a twentieth transistor, a gate electrode of the nineteenth transistor is connected to the blanking node, a first electrode of the nineteenth transistor is connected to an eighth clock signal terminal to receive an eighth clock signal as the second input signal, and a second electrode of the nineteenth transistor is connected to a first electrode of the twentieth transistor, a gate electrode of the twentieth transistor is connected to a seventh clock signal terminal to receive the seventh clock signal, and a second electrode of the twentieth transistor is connected to the first node.

For example, the shift register unit provided by an embodiment of the present disclosure further comprises a display reset circuit. The display reset circuit is connected to the first node and is configured to reset the first node in response to a display reset signal.

For example, in the shift register unit provided by an embodiment of the present disclosure, the display reset circuit comprises a twenty-first transistor. A gate electrode of the twenty-first transistor is connected to a display reset terminal to receive the display reset signal, a first electrode of the twenty-first transistor is connected to the first node, and a second electrode of the twenty-first transistor is connected to a second voltage terminal to receive a second voltage.

For example, the shift register unit provided by an embodiment of the present disclosure further comprises a blanking reset circuit. The blanking reset circuit is connected to the first node and is configured to reset the first node in response to a blanking reset signal.

For example, in the shift register unit provided by an embodiment of the present disclosure, the blanking reset circuit comprises a twenty-second transistor. A gate electrode of the twenty-second transistor is connected to a sixth clock signal terminal to receive the sixth clock signal as the blanking reset signal, and a first electrode of the twenty-second transistor is connected to the first node, and a second electrode of the twenty-second transistor is connected to the second voltage terminal to receive the second voltage.

For example, the shift register unit provided by an embodiment of the present disclosure further comprises a third node control circuit, a first noise reduction circuit, a fourth node control circuit, a second noise reduction circuit, a second input circuit, a display reset circuit, and a blanking reset circuit. The first input circuit comprises a first transistor, a gate electrode of the first transistor is connected to a display control terminal to receive the first control signal, a first electrode of the first transistor is connected to a first voltage terminal to receive a first voltage as the first input signal, and a second electrode of the first transistor is connected to the first node; the third node control circuit comprises a second transistor, a third transistor, and a fourth transistor, a gate electrode and a first electrode of the second transistor are connected to each other and are connected to a first clock signal terminal to receive a first clock signal, a second electrode of the second transistor is connected to the third node, a gate electrode and a first electrode of the third transistor are connected to each other and are connected to a second clock signal terminal to receive a second clock signal, a second electrode of the third transistor is connected to the third node, a gate electrode of the fourth transistor is connected to the first node, a first electrode of the fourth transistor is connected to the third node, and a second electrode of the fourth transistor is connected to a second voltage terminal to receive a second voltage; the first noise reduction circuit comprises a fifth transistor and a sixth transistor, a gate electrode of the fifth transistor is connected to the third node, a first electrode of the fifth transistor is connected to the first node, and a second electrode of the fifth transistor is connected to the second voltage terminal to receive the second voltage, a gate electrode of the sixth transistor is connected to the third node, and a first electrode of the sixth transistor is connected to the second node, and a second electrode of the sixth transistor is connected to the second voltage terminal to receive the second voltage; the output control circuit comprises a seventh transistor and a first capacitor, a gate electrode of the seventh transistor is connected to the first node, a first electrode of the seventh transistor is connected to a third clock signal terminal to receive a third clock signal as the output control signal, a second electrode of the seventh transistor is connected to the second node, a first terminal of the first capacitor is connected to the first node, and a second terminal of the first capacitor is connected to the second node; the fourth node control circuit comprises an eighth transistor, a ninth transistor, and a tenth transistor, a gate electrode and a first electrode of the eighth transistor are connected to each other and are connected to the first clock signal terminal to receive the first clock signal, a second electrode of the eighth transistor is connected to the fourth node, a gate electrode and a first electrode of the ninth transistor are connected to each other and are connected to the second clock signal terminal to receive the second clock signal, a second electrode of the ninth transistor is connected to the fourth node, and a gate electrode of the tenth transistor is connected to the second node, a first electrode of the tenth transistor is connected to the fourth node, and a second electrode of the tenth transistor is connected to the second voltage terminal to receive the second voltage; the second noise reduction circuit comprises an eleventh transistor, a twelfth transistor, a thirteenth transistor, and a fourteenth transistor, a gate electrode of the eleventh transistor is connected to the fourth node, a first electrode of the eleventh transistor is connected to the second node, a second electrode of the eleventh transistor is connected to the second voltage terminal to receive the second voltage, a gate electrode of the twelfth transistor is connected to the fourth node, a first electrode of the twelfth transistor is connected to the shift output terminal, a second electrode of the twelfth transistor is connected to the second voltage terminal to receive the second voltage, a gate electrode of the thirteenth transistor is connected to the fourth node, a first electrode of the thirteenth transistor is connected to a first scan signal output terminal, and a second electrode of the thirteenth transistor is connected to a third voltage terminal to receive a third voltage, a gate electrode of the fourteenth transistor is connected to the fourth node, and a first electrode of the fourteenth transistor is connected to a second scan signal output terminal, and a second electrode of the fourteenth transistor is connected to the third voltage terminal to receive the third voltage; the output circuit comprises a fifteenth transistor, a sixteenth transistor, a seventeenth transistor, and a second capacitor, a gate electrode of the fifteenth transistor is connected to the second node, a first electrode of the fifteenth transistor is connected to a fourth clock signal terminal to receive a fourth clock signal, a second electrode of the fifteenth transistor is connected to the shift output terminal, a gate electrode of the sixteenth transistor is connected to the second node, a first electrode of the sixteenth transistor is connected to the fourth clock signal terminal to receive the fourth clock signal, a second electrode of the sixteenth transistor is connected to the first scan signal output terminal, a gate electrode of the seventeenth transistor is connected to the second node, a first electrode of the seventeenth transistor is connected to a fifth clock signal terminal to receive a fifth clock signal, and a second electrode of the fifteenth transistor is connected to the second scan signal output terminal; the charging sub-circuit comprises an eighteenth transistor, a gate electrode of the eighteenth transistor is connected to a sixth clock signal terminal to receive a sixth clock signal, a first electrode of the eighteenth transistor is connected to a blanking control terminal to receive the second control signal, and a second electrode of the eighteenth transistor is connected to a blanking node; the storage sub-circuit comprises a third capacitor, a first terminal of the third capacitor is connected to the blanking node, and a second terminal of the third capacitor is connected to the second voltage terminal to receive the second voltage; the isolation sub-circuit comprises a nineteenth transistor and a twentieth transistor, a gate electrode of the nineteenth transistor is connected to the blanking node, a first electrode of the nineteenth transistor is connected to an eighth clock signal terminal to receive an eighth clock signal as a second input signal, a second electrode of the nineteenth transistor is connected to a first electrode of the twentieth transistor, a gate electrode of the twentieth transistor is connected to a seventh clock signal terminal to receive a seventh clock signal, and a second electrode of the twentieth transistor is connected to the first node; the display reset circuit comprises a twenty-first transistor, a gate electrode of the twenty-first transistor is connected to a display reset terminal to receive a display reset signal, a first electrode of the twenty-first transistor is connected to the first node, and a second electrode of the twenty-first transistor is connected to the second voltage terminal to receive the second voltage; the blanking reset circuit comprises a twenty-second transistor, a gate electrode of the twenty-second transistor is connected to the sixth clock signal terminal to receive the sixth clock signal as a blanking reset signal, a first electrode of the twenty-second transistor is connected to the first node, and a second electrode of the twenty-second transistor is connected to the second voltage terminal to receive the second voltage.

At least one embodiment of the present disclosure also provides a gate driving circuit, and the gate driving circuit comprises a plurality of cascaded shift register units according to any one of the embodiments of the present disclosure.

For example, in the gate driving circuit provided by an embodiment of the present disclosure, a display control terminal of an (n+2)-th stage of shift register unit is connected to a shift output terminal of an n-th stage of shift register unit; and a blanking control terminal of an (n+1)-th stage of shift register unit is connected to the shift output terminal of the n-th stage of shift register unit, n is an integer greater than zero.

At least one embodiment of the present disclosure also provides a display device, comprising the gate driving circuit according to any one of the embodiments of the present disclosure.

At least one embodiment of the present disclosure also provides a driving method of a shift register unit, comprising: in a first phase, in response to the first control signal, inputting the first input signal to the first node through the first input circuit; in a second phase, outputting the output control signal to the second node under control of the level of the first node; and in a third phase, outputting the output signal to the output terminal under control of the level of the second node.

BRIEF DESCRIPTION OF THE DRAWINGS

In order to clearly illustrate the technical solutions of the embodiments of the disclosure, the drawings of the embodiments will be briefly described in the following; it is obvious that the described drawings are only related to some embodiments of the disclosure and thus are not limitative to the disclosure.

DETAILED DESCRIPTION

Figure 1:
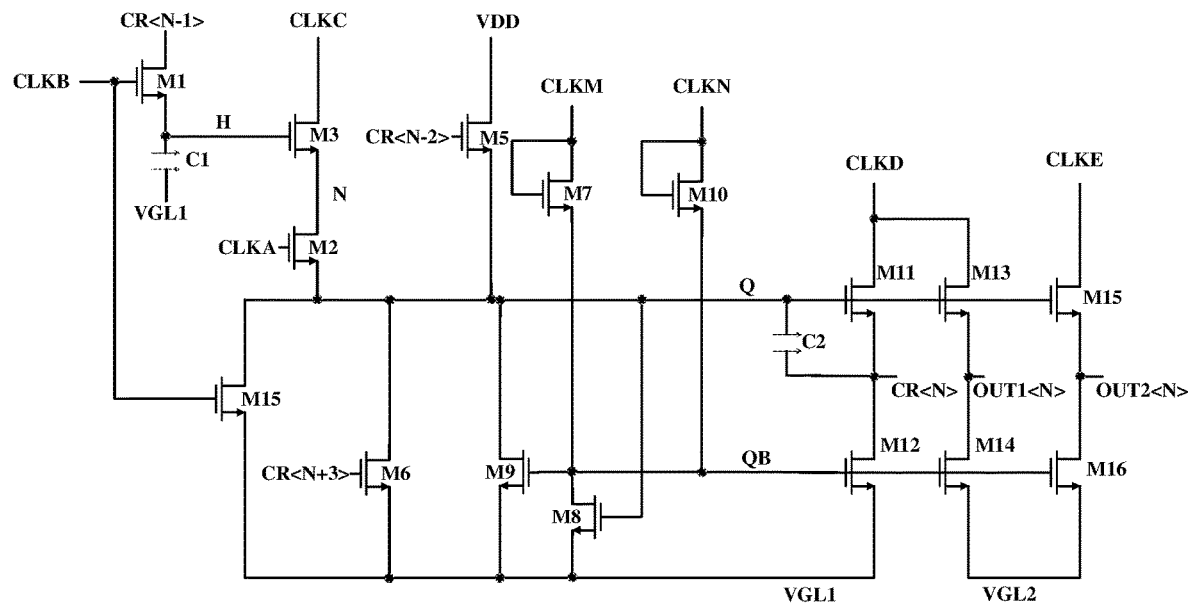
FIG. 1 is a circuit diagram of a shift register unit provided by at least one embodiment of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present invention belongs. The terms "first," "second," etc., which are used in the description and the claims of the present application for invention, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the absolute position of the object which is described is changed, the relative position relationship may be changed accordingly.

The present disclosure is described below through several specific embodiments. In order to keep the following description of the embodiments of the present disclosure clear and concise, detailed descriptions of known functions and known components may be omitted. In a case where any component of an embodiment of the present disclosure appears in more than one drawing, the component is represented by the same reference numeral in each drawing.

In general OLED display panels, compensation technology is required to improve display quality. When compensating sub-pixel units in an OLED display panel, in addition to setting a pixel compensation circuit in the sub-pixel unit to perform internal compensation, external compensation can also be performed by setting a sense transistor. When performing the external compensation, a gate driving circuit including shift register units needs to provide a driving signal for a scan transistor and a driving signal for the sense transistor to the sub-pixel unit in the display panel, respectively. For example, a scan driving signal (i.e., a display output signal) for the scan transistor is provided in a display period (Display) of one frame, and a sense driving signal (i.e., a blanking output signal) for the sense transistor is provided in a blanking period (Blank) of one frame.

Similarly, in the OLED display panel, according to the actual needs, a plurality of output terminals may be provided to achieve to output a plurality of scan driving signals or sense driving signals simultaneously. FIG. 1 is a circuit diagram of a shift register unit according to an embodiment of the present disclosure. As shown in FIG. 1, under control of a pull-up node Q, a plurality of output transistors (for example, an output transistor M11, an output transistor M13, and an output transistor M15) control a plurality of output terminals to simultaneously output a plurality of clock signals, for example, a clock signal CLKD is output at a first output terminal OUT1 and a shift output terminal CR, and a clock signal CLKE is output at a second output terminal OUT2 as a scan driving signal or a sense driving signal. The timing of the clock signal CLKD and the timing of the clock signal CLKE may be the same or different. In a case where the timing of the clock signal CLKD and the timing of the clock signal CLKE are different, due to the bootstrap effect of a storage capacitor C2, the change of the clock signal CLKD affects the change of a level of the pull-up node Q, thereby affecting the conduction degree of the output transistor M13 of the second output terminal OUT2, which may cause output of the second output terminal OUT2 to be abnormal.

At least one embodiment of the present disclosure provides a shift register unit, and the shift register unit comprises a first input circuit, an output control circuit, and an output circuit. The first input circuit is connected to a first node, and is configured to output a first input signal to the first node in response to a first control signal; the output control circuit is connected to the first node and a second node, and is configured to output an output control signal to the second node under control of a level of the first node; and the output circuit comprises an output terminal, is connected to the second node, and is configured to output an output signal to the output terminal under control of a level of the second node. Embodiments of the present disclosure also provide a gate driving circuit, a display device, and a driving method corresponding to the above-mentioned shift register unit.

A circuit structure of the shift register unit provided by the above embodiments of the present disclosure is simple, can meet the requirements of a high-resolution narrow frame, and moreover, the shift register unit can also achieve a plurality of lossless and interference-free outputs, avoid an abnormal output phenomenon caused by the mutual influence between signals, and enhance the reliability of the circuit.

The embodiments of the present disclosure and examples thereof will be described in detail below with reference to the drawings.

Figure 2:
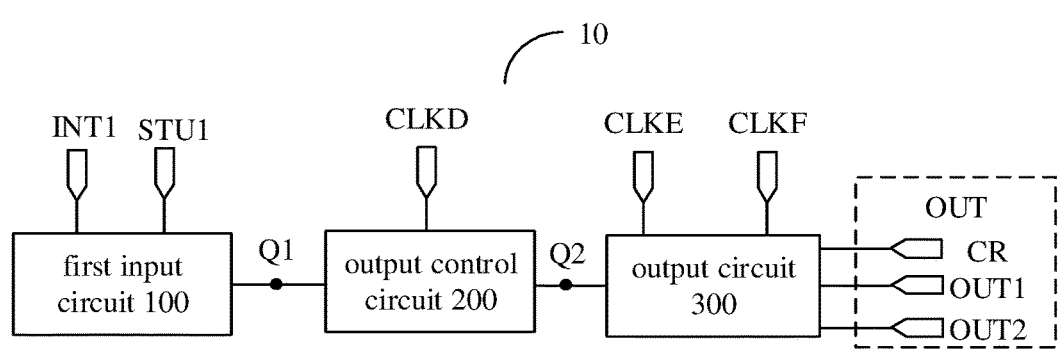
FIG. 2 is a schematic diagram of a shift register unit provided by at least one embodiment of the present disclosure.

FIG. 2 is a schematic diagram of a shift register unit provided by at least one embodiment of the present disclosure. As shown in FIG. 2, the shift register unit 10 may comprise a first input circuit 100, an output control circuit 200, and an output circuit 300. A gate driving circuit can be obtained by cascading a plurality of the shift register units 10, and the gate driving circuit is used to drive a display panel, and sequentially provides scan signals to a plurality of gate lines of the display panel, thereby performing progressive or interlaced scanning and the like while the display panel displays one frame of picture.

As shown in FIG. 2, the first input circuit 100 is connected to a first node Q1 (for example, a pull-up node here), and is configured to output a first input signal to the first node Q1 in response to a first control signal. For example, in some examples, the first input circuit 100 is connected to a first input signal terminal INT1, a display control terminal STU1, and the first node Q1, and is configured to be turned on under control of the first control signal provided by the display control terminal STU1, so that the first input signal terminal INT1 is connected to the first node Q1, and the first input signal provided by the first input signal terminal INT1 is input to the first node Q1 to pull up (for example, charge) a potential of the first node Q1 to an operating potential.

The output control circuit 200 is connected to the first node Q1 and a second node Q2 (for example, also a pull-up node), and is configured to output an output control signal to the second node Q2 under control of a level of the first node Q1. For example, in some examples, the output control circuit 200 is connected to the first node Q1, the second node Q2, and a third clock signal terminal CLKD, and is configured to be turned on under control of the level of the first node Q1, so that a third clock signal provided by the third clock signal terminal CLKD is output to the second node Q2, and serves as the output control signal.

The output circuit 300 comprises an output terminal OUT, is connected to the second node Q2, and is configured to output an output signal to the output terminal OUT under control of a level of the second node Q2. For example, the output terminal OUT comprises a shift output terminal CR and at least one scan signal output terminal, so that output signals, such as a fourth clock signal provided by a fourth clock signal terminal CLKE and a fifth clock signal provided by a fifth clock signal terminal CLKF, are output to the shift output terminal and the scan signal output terminal, respectively, so as to improve the driving capability of the shift register unit 10. For example, the at least one scan signal output terminal comprise a first scan signal output terminal OUT1 and a second scan signal output terminal OUT2. For example, the shift output terminal CR is used to provide a first input signal, a second input signal, and a reset signal to a next-stage of shift register unit 10, and the scan signal output terminal is used to provide a driving signal to pixel circuits of pixel units located in a row in the display panel. For example, the shift output terminal CR and one of the scan signal output terminals output the same output signal, and the other of the scan signal output terminals outputs the other output signal.

For example, the output circuit 300 is connected to the fourth clock signal terminal CLKE, the fifth clock signal terminal CLKF, the second node Q2, and the output terminal OUT, and is configured to be turned on under control of the level of the second node Q2, so as to output the fourth clock signal provided by the fourth clock signal terminal CLKE to the shift output terminal CR and the first scan signal output terminal OUT1, and output the fifth clock signal provided by the fifth clock signal terminal CLKF to the second scan signal output terminal OUT2, thereby avoid generating an abnormal output phenomenon due to the level of the first node Q1 and the level of the second node Q2 being affected by respective clock signals.

The shift register unit provided by the above embodiment of the present disclosure controls the output of the output terminal through the second node Q2, thereby avoiding the influence of changes of the respective clock signals in the output circuit 300 on the first node Q1, so that the level of the first node Q1 is kept stable, and thus, under control of the level of the first node Q1, the level of the second node Q2 is kept stable. Therefore, under control of the level of the second node Q2, each clock signal of the output circuit 300 can be stably output, thereby achieving a plurality of lossless and interference-free outputs, avoiding the abnormal output phenomenon due to the mutual influence of the signals, and enhancing the reliability of the circuit.

Figure 3:
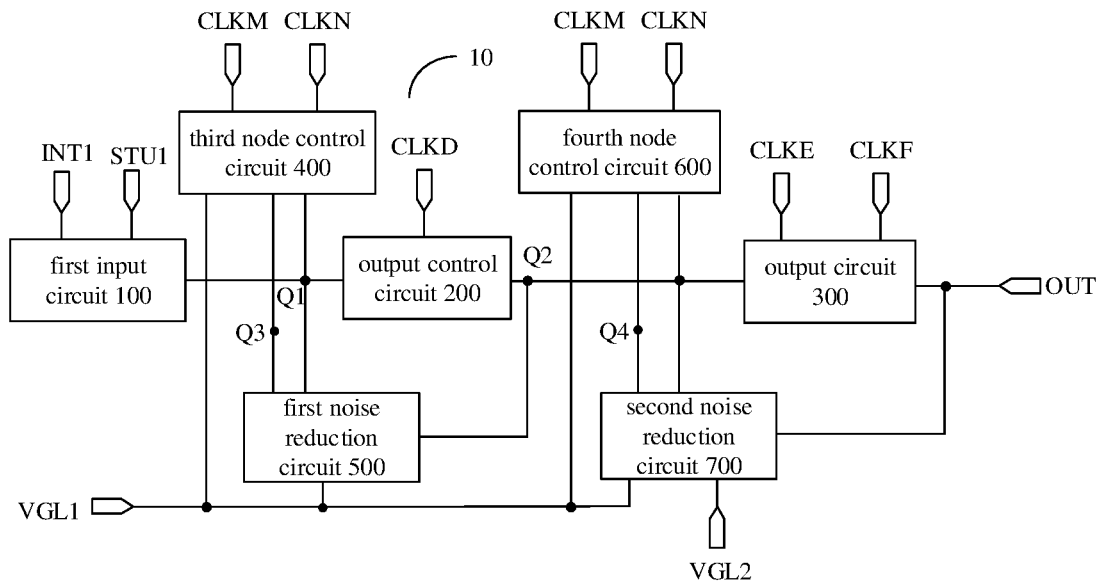
FIG. 3 is a schematic diagram of another shift register unit provided by at least one embodiment of the present disclosure.

FIG. 3 is a schematic block diagram of another shift register unit provided by at least one embodiment of the present disclosure. As shown in FIG. 3, the shift register unit 10 also comprises a third node control circuit 400, a fourth node control circuit 600, a first noise reduction circuit 500, and a second noise reduction circuit 700. It should be noted that other circuit structures of the shift register unit 10 as shown in FIG. 3 are basically the same as the circuit structure of the shift register unit 10 as shown in FIG. 2, and the similar descriptions are not repeated herein.

In addition, it should be noted that, in order to enable the descriptions clear and concise, FIG. 3 does not show the shift output terminal CR, the first scan signal output terminal OUT1, and the second scan signal output terminal OUT2, and only shows a total output terminal OUT including the above three output terminals.

As shown in FIG. 3, the third node control circuit 400 is connected to the first node Q1 and the third node Q3 (for example, a pull-down node here), and is configured to control a level of the third node Q3 under control of the level of the first node Q1. For example, the third node control circuit 400 is connected to the first clock signal terminal CLKM, the second clock signal terminal CLKN, a second voltage terminal VGL1 (for example, a low voltage terminal), the first node Q1, and the third node Q3, the third node control circuit 400 is configured to be turned on in a case where the first node Q1 is at a high level, so that the third node Q3 is connected to the second voltage terminal VGL1 or a separately provided voltage terminal (for example, a low voltage terminal), thereby pulling down (such as, discharging) the third node Q3 to a low level; the third node control circuit 400 is turned off in a case where the first node Q1 is at a low level, so that the third node Q3 is connected to one of the first clock signal terminal CLKM and the second clock signal terminal CLKN, thereby pulling up (e.g., charging) the third node Q3 to a high level. For example, the third node control circuit 400 may be an inverter. For example, the first clock signal provided by the first clock signal terminal CLKM and the second clock signal provided by the second clock signal terminal CLKN are continuous in time, and continuously control the level of the third node Q3, so that the transistors connected to the third node Q3 can work alternately, thereby extending the life of these transistors. For example, in other examples, the first clock signal terminal CLKM and the second clock signal terminal CLKN may also be replaced by voltage terminals that provide DC high levels (or DC low levels in a case where the transistors are implemented as P-type transistors), and the embodiments of the present disclosure are not limited thereto.

For example, the second voltage terminal VGL1 is configured to provide a DC low level signal (for example, the DC low level signal is lower than or equal to a low level portion of the clock signal), for example, is grounded, here the DC low level signal is referred to as a second voltage, this case may apply to the following embodiments, and similar description will not be repeated again.

The first noise reduction circuit 500 is connected to the first node Q1, the second node Q2, and the third node Q3, and is configured to perform noise reduction on the first node Q1 and the second node Q2 under control of the level of the third node Q3. For example, the first noise reduction circuit 500 is also connected to the second voltage terminal VGL1, and is configured to electrically connect the first node Q1 and the second node Q2 to the second voltage terminal VGL1 or a separately provided voltage terminal (for example, a low voltage terminal) under control of the level of the third node Q3, thereby pulling down (such as, discharging) the first node Q1 and the second node Q2 to a non-operating potential to achieve noise reduction. In other examples, noise reduction circuits may also be respectively provided for the first node Q1 and the second node Q2 to perform noise reduction, respectively.

The fourth node control circuit 600 is connected to the second node Q2 and a fourth node Q4 (for example, a pull-down node here), and is configured to control a level of the fourth node Q4 under control of the level of the second node Q2. For example, the fourth node control circuit 600 is connected to the first clock signal terminal CLKM, the second clock signal terminal CLKN, the second voltage terminal VGL1, the second node Q2, and the fourth node Q4, the fourth node control circuit 600 is configured to be turned on in a case where the second node Q2 is at a high level, so that the fourth node Q4 is connected to the second voltage terminal VGL1 or a separately provided voltage terminal (for example, a low voltage terminal), thereby pulling down the fourth node Q4 to a low level; and the fourth node control circuit 600 is configured to be turned off in a case where the second node Q2 is at a low level, so that the fourth node Q4 is connected to one of the first clock signal terminal CLKM and the second clock signal terminal CLKN, thereby pulling up the fourth node Q4 to a high level. For example, the fourth node control circuit 600 may be an inverter.

The second noise reduction circuit 700 is connected to the second node Q2, the fourth node Q4, and the output terminal OUT, and is configured to perform noise reduction on the second node Q2 and the output terminal OUT under control of the level of the fourth node Q4. For example, the second noise reduction circuit 700 is also connected to the second voltage terminal VGL1 and the third voltage terminal VGL2 (for example, a low voltage terminal), and is configured to, under control of the level of the fourth node Q4, electrically connect the second node Q2 to the second voltage terminal VGL1 or a separately provided voltage terminal (for example, a low voltage terminal) and electrically connect the output terminal OUT to the third voltage terminal VGL2 or a separately provided voltage terminal (for example, a low voltage terminal), thereby pulling down the second node Q2 and the output terminal OUT to a non-operating potential to achieve noise reduction.

Figure 4:
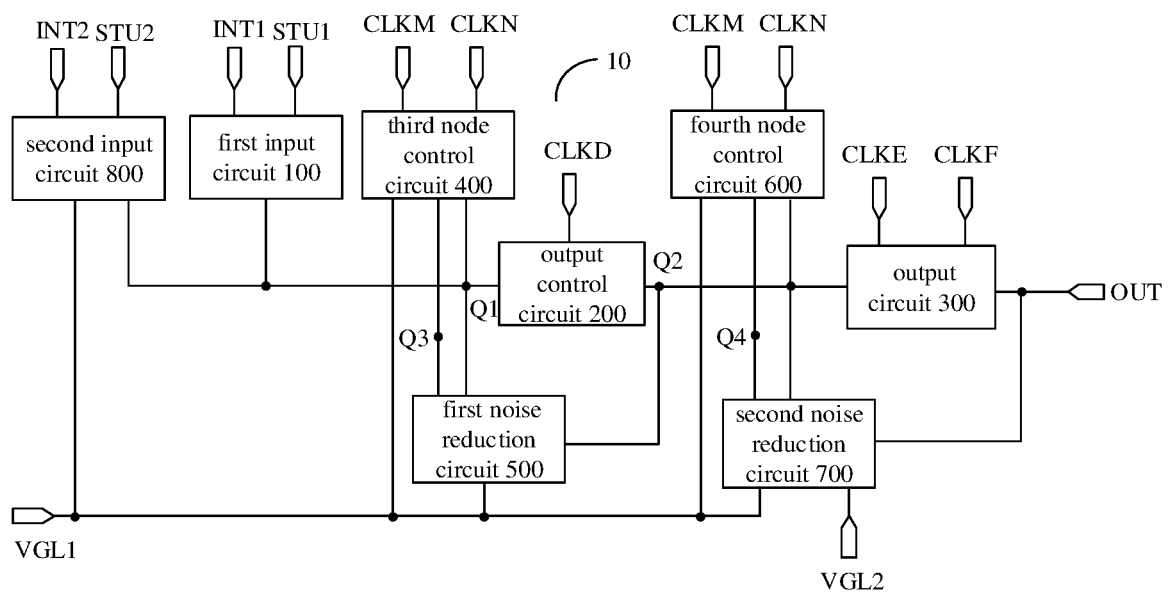
FIG. 4 is a schematic diagram of still another shift register unit provided by at least one embodiment of the present disclosure.

FIG. 4 is a schematic block diagram of still another shift register unit provided by at least one embodiment of the present disclosure. As shown in FIG. 4, the shift register unit further comprises a second input circuit 800. It should be noted that other circuit structures of the shift register unit 10 as shown in FIG. 4 are basically the same as the circuit structures of the shift register unit 10 as shown in FIG. 3, and the similar descriptions are not repeated herein.

As shown in FIG. 4, the second input circuit 800 is connected to the first node Q1, and is configured to input a second input signal to the first node Q1 according to a second control signal. For example, the second input circuit 800 is electrically connected to a blanking control terminal STU2, a second input signal terminal INT2, and the first node Q1, and is configured to receive and store the second control signal provided by the blanking control terminal STU2, and output the second input signal provided by the second input signal terminal INT2 to the first node Q1 according to the second control signal in a blanking period of one frame, thereby pulling up the potential of the first node Q1 to the operating potential.

For example, in some examples, the second input circuit 800 may receive and store the second control signal in a display period of one frame, and output the second input signal to the first node Q1 according to the stored second control signal in the blanking period of one frame, thereby pulling up the potential of the first node Q1 to the operating potential. For example, in other examples, the second input circuit 800 may receive and store the second control signal in a blanking period of one frame, and output the second input signal to the first node Q1, according to the stored second control signal, in a blanking period of a next frame, thereby pulling up the potential of the first node Q1 to the operating potential.

In the shift register unit 10 provided by the above embodiments of the present disclosure, the first input circuit 100

(implemented as a display scan sub-circuit), the output circuit 300, and the second input circuit 800 (implemented as a sense sub-circuit) may be integrated, in a case where the display panel is driven by the gate driving circuit obtained by cascading a plurality of shift register units 10, a blanking scan signal in a blanking period of a frame and a display scan signal in a display period of a frame can be output through the same output circuit, that is, the first input circuit 100 and the second input circuit 800 can share the same output circuit 300 to achieve to output the output signals, thereby simplifying the circuit structure of the shift register unit and the circuit structure of the obtained gate driving circuit, reducing the size of the shift register unit and the size of the gate driving circuit including the shift register unit, and meeting the requirements of high resolution and narrow frame.

For example, in this example, clock signals provided by the third clock signal terminal CLKD, the fourth clock signal terminal CLKE, and the fifth clock signal terminal CLKF are all composite signals, for example, each of the fourth clock signal and the fifth clock signal may comprise the first output signal output in the display period and the second output signal output in the blanking period, respectively. For example, the first output signal and the second output signal may be two independent waveforms having different widths and timings. For example, in a display period of one frame, the output circuit 300 outputs the first output signal through the output terminal OUT under control of the level of the first node Q1, so as to drive scan transistors for data input in corresponding pixel units, through a gate line connected to the output terminal OUT, thereby performing display; and in a blanking period of one frame, the output circuit 300 outputs the second output signal through the output terminal OUT under control of the level of the first node Q1 to drive sense transistors for compensation detection in the pixel units, thereby performing compensation detection.

Figure 5:
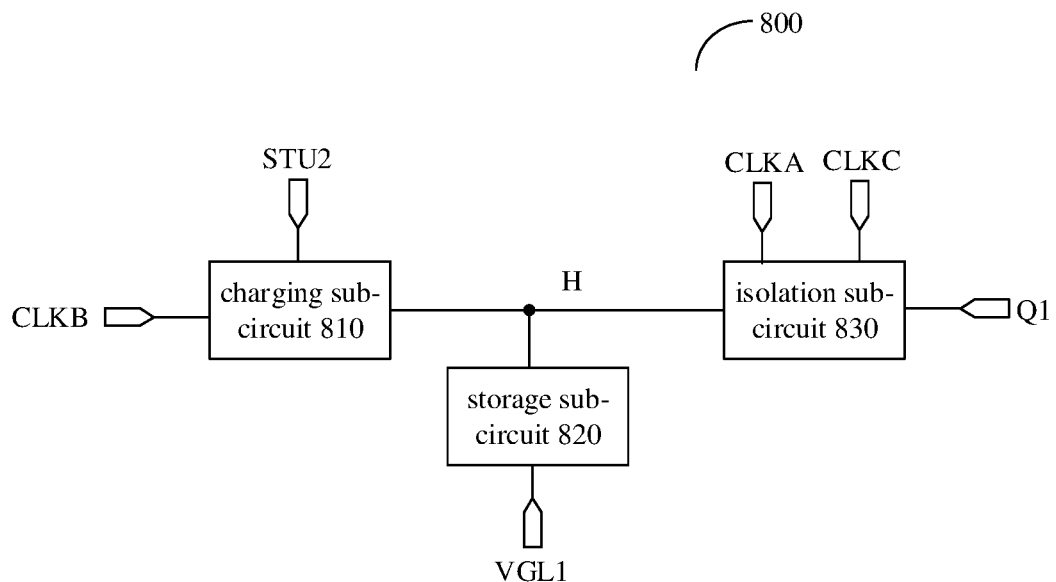
FIG. 5 is a schematic diagram of an exemplary second input circuit provided by at least one embodiment of the present disclosure.

FIG. 5 is a schematic diagram of an exemplary second input circuit provided by at least one embodiment of the present disclosure. As shown in FIG. 5, the second input circuit 800 comprises a charging sub-circuit 810, a storage sub-circuit 820, and an isolation sub-circuit 830.

As shown in FIG. 5, the charging sub-circuit 810 is connected to a blanking node H, and is configured to input a second control signal to the blanking node H in response to a sixth clock signal. For example, the charging sub-circuit 810 is connected to a sixth clock signal terminal CLKB, a blanking control terminal STU2, and the blanking node H, and is configured to be turned on under control of the sixth clock signal provided by the sixth clock signal terminal CLKB, so as to electrically connect the blanking control terminal STU2 to the blanking node H, thereby writing the second control signal to the blanking node H. For example, in some examples, the charging sub-circuit 810 is turned on under control of the sixth clock signal, and in a case where the second control signal is at a high level at this time, the blanking node H is charged.

The storage sub-circuit 820 is connected to the blanking node H and is configured to store the level of the second control signal input by the charging sub-circuit 810. For example, the storage sub-circuit 820 is also connected to the second voltage terminal VGL1 to store the level of the second control signal.

The isolation sub-circuit 830 is connected to the blanking node H and the first node Q1, and is configured to input the second input signal to the first node Q1 under control of the level of the blanking node H and a seventh clock signal. For example, the isolation sub-circuit 830 is connected to the blanking node H, the first node Q1, an eighth clock signal terminal CLKC (that is, the second input signal terminal INT2), and the seventh clock signal terminal CLKA, and is configured to be turned on under the common control of the level of the blanking node H and the seventh clock signal provided by the seventh clock signal terminal CLKA, so that the eighth clock signal terminal CLKC is electrically connected to the first node Q1, thereby inputting the second input signal to the first node Q1. For example, in some examples, the isolation sub-circuit 830 is turned on under the common control of the level of the blanking node H and the seventh clock signal, and in a case where the second input signal is at a high level, the first node Q1 can be charged.

It should be noted that, in the embodiments of the present disclosure, the second input circuit 800 may comprise any applicable sub-circuits, and is not limited to the above-mentioned charging sub-circuit 810, storage sub-circuit 820, and isolation sub-circuit 830, as long as the corresponding function of the second input circuit 800 can be achieved.

Figure 6:
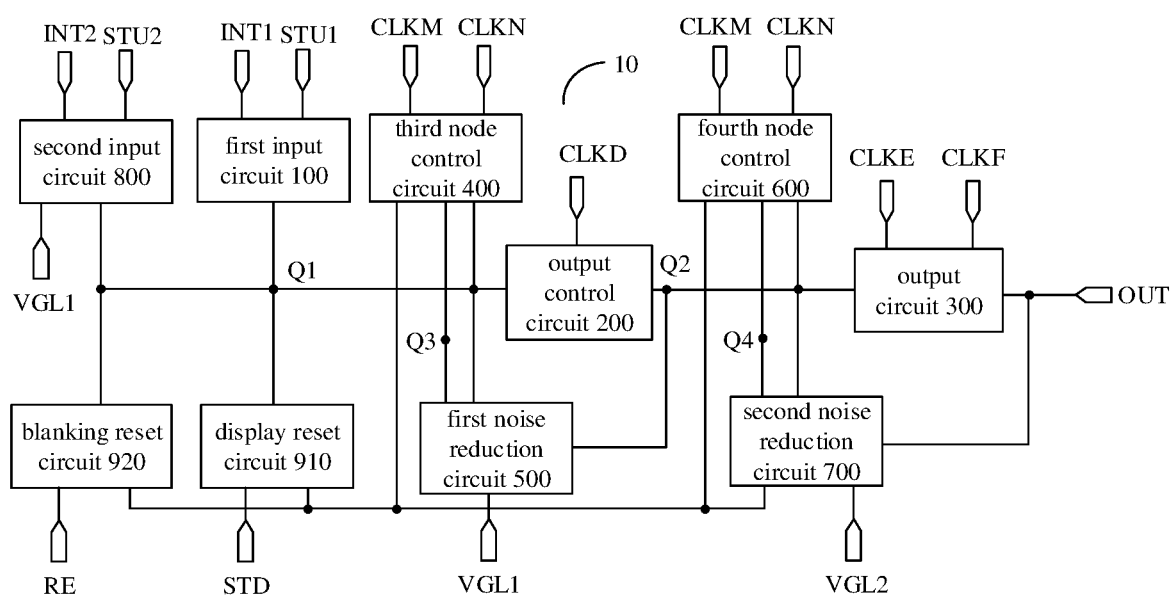
FIG. 6 is a schematic diagram of still yet another shift register unit provided by at least one embodiment of the present disclosure.

FIG. 6 is a schematic block diagram of still yet another shift register unit provided by at least one embodiment of the present disclosure. As shown in FIG. 6, the shift register unit 10 in this embodiment further comprises a display reset circuit 910 and a blanking reset circuit 920. The other structures of the shift register unit 10 as shown in FIG. 6 are basically the same as the circuit structures of the shift register unit 10 described in FIG. 5, and similar description will not be repeated here.

As shown in FIG. 6, the display reset circuit 910 is connected to the first node Q1, and is configured to reset the first node Q1 in response to a display reset signal. For example, the display reset circuit 910 is connected to the first node Q1, a display reset terminal STD, and the second voltage terminal VGL1, and is configured to be turned on under control of the display reset signal provided by the display reset signal terminal STD, so that the first node Q1 is electrically connected to the second voltage terminal VGL1 or a separately provided voltage terminal (for example, a low voltage terminal), thereby resetting the first node Q1. For example, in a display period of one frame, after the output circuit 300 finishes outputting the signal, the first node Q1 is reset by the display reset circuit 910.

The blanking reset circuit 920 is connected to the first node Q1, and is configured to reset the first node Q1 in response to a blanking reset signal. For example, the blanking reset circuit 920 is connected to a blanking reset signal terminal RE, the second voltage terminal VGL1, and the first node Q1, and is configured to be turned on under control of the blanking reset signal provided by the blanking reset signal terminal RE, so that the first node Q1 is electrically connected to the second voltage terminal VGL1 or a separately provided voltage terminal (for example, a low voltage terminal), thereby resetting the first node Q1. For example, in the blanking period of one frame, after the output circuit 300 finishes outputting the signal, the first node Q1 is reset by the blanking reset circuit 920.

Figure 7:
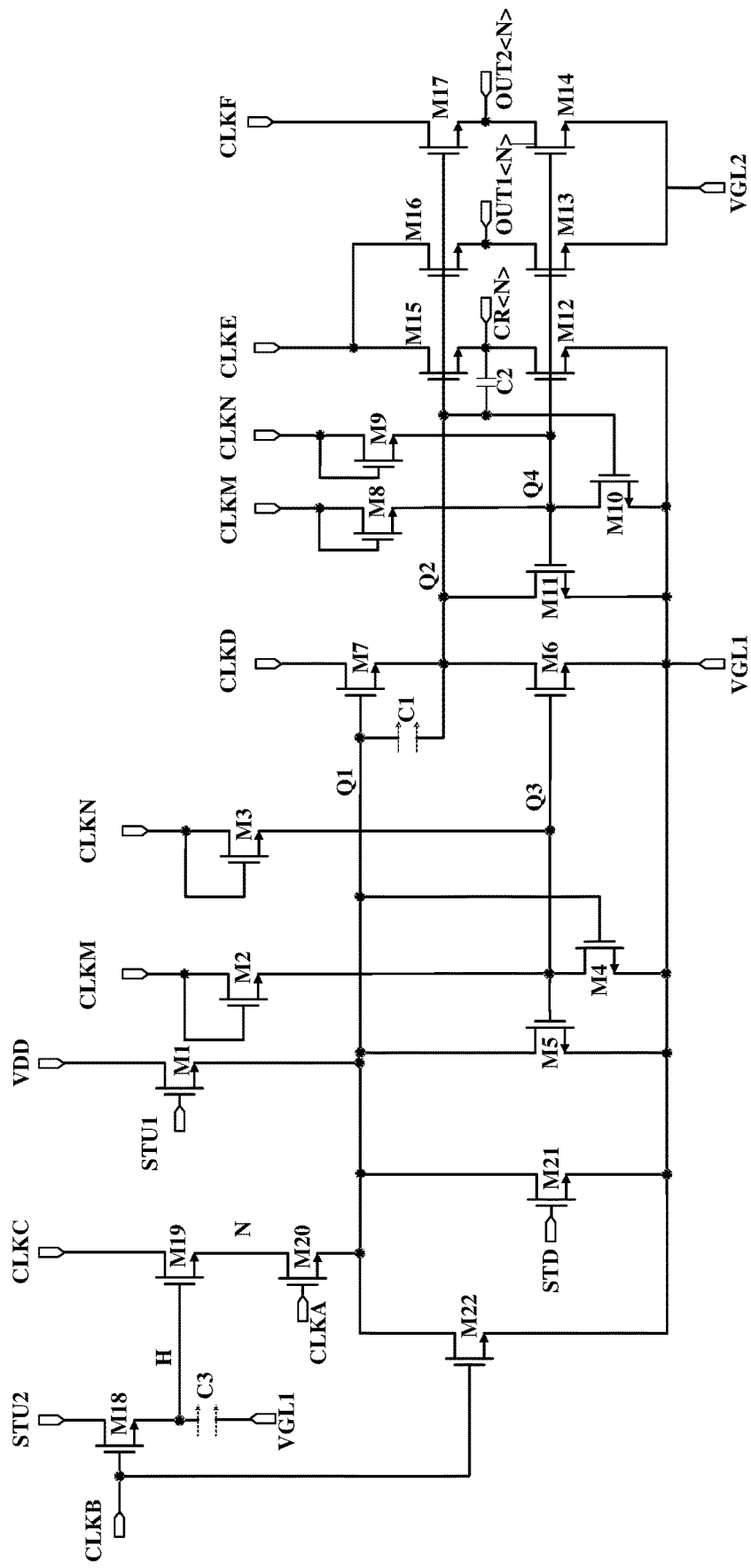
FIG. 7 is a circuit schematic diagram of a specific implementation example of the shift register unit as shown in FIG. 6.

FIG. 7 is a schematic circuit diagram of a specific implementation example of the shift register unit as shown in FIG. 6. As shown in FIG. 7, the shift register unit 10 comprises first to twenty-second transistors M1-M22, and further comprises first to third capacitors C1 to C3. It should be noted that, the following description is described by taking a case that each transistor is an N-type transistor as an example, but this case does not constitute a limitation on the embodiments of the present disclosure.

Figure 8:
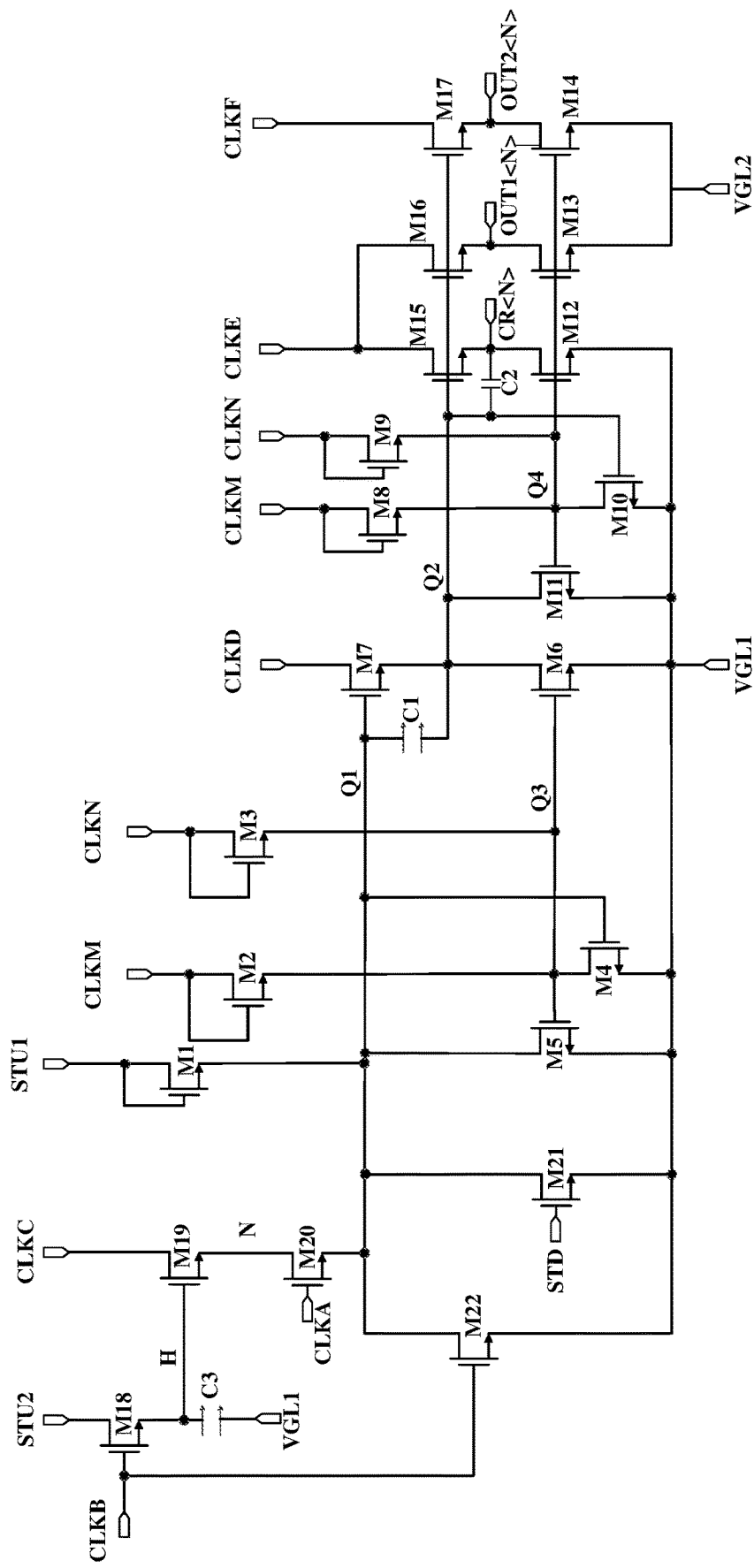
FIG. 8 is a circuit schematic diagram of another specific implementation example of the shift register unit as shown in FIG. 6.

As shown in FIG. 7, in this example, in more detail, the first input circuit 100 may be implemented as a first transistor M1. In some examples, as shown in FIG. 7, a gate electrode of the first transistor M1 is connected to the display control terminal STU1 to receive the first control signal, a first electrode of the first transistor M1 is connected to a first voltage terminal VDD (that is, the first input terminal INT1) to receive a first voltage as the first input signal, and a second electrode of the first transistor M1 is connected to the first node Q1. For example, the first voltage terminal VDD is configured to provide a DC high level signal (for example, the DC high level signal is higher than or equal to a high level portion of a clock signal), and the DC high level signal is referred to as the first voltage (for example, the first voltage is greater than the second voltage), this case can apply to the following embodiments, and similar description will not be repeated again. In a case where the first control signal is an active level (for example, a high level), the first transistor M1 is turned on, so that the first voltage terminal VDD is electrically connected to the first node Q1, thereby writing the first voltage into the first node Q1 and pulling up the potential of the first node Q1 to the operating potential. In another example, as shown in FIG. 8, the gate electrode and the first electrode of the first transistor M1 may be connected to each other, and are connected to the display control terminal STU1 to receive the first control signal, the second electrode of the first transistor M1 is connected to the first node Q1, and the embodiments of the present disclosure are not limited thereto.

The third node control circuit 400 may be implemented as a second transistor M2, a third transistor M3, and a fourth transistor M4. For example, in some examples, a gate electrode and a first electrode of the second transistor M2 are connected to each other and are connected to the first clock signal terminal CLKM to receive the first clock signal, and a second electrode of the second transistor M2 is connected to the third node Q3. A gate electrode and a first electrode of the third transistor M3 are connected to each other and are connected to the second clock signal terminal CLKN to receive the second clock signal, and a second electrode of the third transistor M3 is connected to the third node Q3. A gate electrode of the fourth transistor M4 is connected to the first node Q1, a first electrode of the fourth transistor M4 is connected to the third node Q3, and a second electrode of the fourth transistor M4 is connected to the second voltage terminal VGL1 to receive the second voltage. For example, the first clock signal provided by the first clock signal terminal CLKM and the second clock signal provided by the second clock signal terminal CLKN are continuous in time, so that the second transistor M2 and the third transistor M3 work alternately, thereby extending the service life.

For example, in other examples, the first clock signal terminal CLKM and the second clock signal terminal CLKN may be replaced by two voltage terminals that provide high levels, for example, in a case where one voltage terminal is at a high level, the other voltage terminal provides a low level, so that the second transistor M2 and the third transistor M3 can work alternately to extend the service life.

The first noise reduction circuit 500 may be implemented as a fifth transistor M5 and a sixth transistor M6. For example, a gate electrode of the fifth transistor M5 is connected to the third node Q3, a first electrode of the fifth transistor M5 is connected to the first node Q1, and a second electrode of the fifth transistor M5 is connected to the second voltage terminal VGL1 to receive the second voltage. A gate electrode of the sixth transistor M6 is connected to the third node Q3, a first electrode of the sixth transistor M6 is connected to the second node Q2, and a second electrode of the sixth transistor M6 is connected to the second voltage terminal VGL1 to receive the second voltage.

For example, in a case where the third node Q3 is at an active level (for example, a high level), the fifth transistor M5 and the sixth transistor M6 are both turned on, so that the first node Q1 and the second node Q2 are electrically connected to the second voltage terminal VGL1, thereby performing noise reduction on the first node Q1 and the second node Q2.

For example, in a case where the first node Q1 is at an active level (for example, a high level), the fourth transistor M4 is turned on, by designing a channel width-to-length ratio of the fourth transistor M4 and the turned-on second transistor M2 or the turned-on third transistor M3, the potential of the third node Q3 can be pulled down to a low level. In a case where the first node Q1 is at a low level, the fourth transistor M4 is turned off. At this time, the turned-on second transistor M2 or the turned-on third transistor M3 writes a high level signal provided by the first clock signal terminal CLKM or the second clock signal terminal CLKN to the third node Q3 to pull up the potential of the third node Q3 to a high level.

The output control circuit 200 comprises a seventh transistor M7 and a first capacitor C1. For example, a gate electrode of the seventh transistor M7 is connected to the first node Q1, a first electrode of the seventh transistor M7 is connected to a third clock signal terminal CLKD to receive a third clock signal as the output control signal (in a case of including the second input circuit, the third clock signal is a composite signal), and a second electrode of the seventh transistor M7 is connected to the second node Q2. A first terminal of the first capacitor C1 is connected to the first node Q1, and a second terminal of the first capacitor C1 is connected to the second node Q2. In a case where the first node Q1 is at an operating potential (for example, a high level), the seventh transistor M7 is turned on, thereby outputting the third clock signal to the second node Q2.

For example, the fourth node control circuit 600 may be implemented as an eighth transistor M8, a ninth transistor M9, and a tenth transistor M10. For example, a gate electrode and a first electrode of the eighth transistor M8 are connected to each other and are connected to the first clock signal terminal CLKM to receive the first clock signal, and a second electrode of the eighth transistor M8 is connected to the fourth node Q4. A gate electrode and a first electrode of the ninth transistor M9 are connected to each other and are connected to the second clock signal terminal CLKN to receive the second clock signal, and a second electrode of the ninth transistor M9 is connected to the fourth node Q4. A gate electrode of the tenth transistor M10 is connected to the second node Q2, a first electrode of the tenth transistor M10 is connected to the fourth node Q4, and a second electrode of the tenth transistor M10 is connected to the second voltage terminal VGL1 to receive the second voltage.

For example, in a case where the at least one scan signal output terminal comprises a first scan signal output terminal OUT1 <N>and a second scan signal output terminal OUT2 <N>, the second noise reduction circuit 700 comprises an eleventh transistor M11, a twelfth transistor M12, a thirteenth transistor M13, and a fourteenth transistor M14. Please note that the suffix "<N>" here means an N-th stage of shift register unit in the gate driving circuit, and the N-th stage of shift register unit will be described in detail later. A gate electrode of the eleventh transistor M11 is connected to the fourth node Q4, a first electrode of the eleventh transistor M11 is connected to the second node Q2, and a second electrode of the eleventh transistor M11 is connected to the second voltage terminal VGL1 to receive the second voltage. A gate electrode of the twelfth transistor M12 is connected to the fourth node Q4, a first electrode of the twelfth transistor M12 is connected to the shift output terminal CR <N>, and a second electrode of the twelfth transistor M12 is connected to the second voltage terminal VGL1 to receive the second voltage. A gate electrode of the thirteenth transistor M13 is connected to the fourth node Q4, a first electrode of the thirteenth transistor M13 is connected to the first scan signal output terminal OUT1 <N>, and a second electrode of the thirteenth transistor M13 is connected to the third voltage terminal VGL2 to receive the third voltage. A gate electrode of the fourteenth transistor M14 is connected to the fourth node Q4, a first electrode of the fourteenth transistor M14 is connected to the second scan signal output terminal OUT2 <N>, and a second electrode of the fourteenth transistor M14 is connected to the third voltage terminal VGL2 to receive the third voltage. For example, the working principles of the transistors in the fourth node control circuit 600 are the same as the working principles of the transistors in the third node control circuit 400, the working principles of the transistors in the second noise reduction circuit 700 are the same as the working principles of the transistors in the first noise reduction circuit 500, and similar description will not be repeated herein.

For example, the third voltage terminal VGL2 is configured to provide a DC low level signal (for example, the DC low level signal is lower than or equal to a low level portion of the clock signal), for example, is grounded, the DC low level signal is referred to as a third voltage, the following embodiments are the same as those described herein, and similar description will not be repeated again. For example, in some examples, the third voltage at the third voltage terminal VGL2 is higher than the second voltage at the second voltage terminal VGL1; and in another example, the third voltage at the third voltage terminal VGL2 is equal to the second voltage at the second voltage terminal VGL1. The third voltage and the second voltage may be the same or different, which may be determined according to actual needs.

In a case where the fourth node Q4 is at an active level (for example, a high level), the eleventh transistor M11, the twelfth transistor M12, the thirteenth transistor M13, and the fourteenth transistor M14 are all turned on, so that the second node Q2 and the shift output terminal CR <N> are electrically connected to the second voltage terminal VGL1, and the first scan signal output terminal OUT1 <N> and the second scan signal output terminal OUT2 <N> are connected to the third voltage terminal VGL2, thereby performing noise reduction on the second node Q2, the shift output terminal CR <N>, the first scan signal output terminal OUT1 <N>, and the second scan signal output terminal OUT2 <N>. It should be noted that, in the embodiments of the present disclosure, in a case where there are a plurality of shift output terminals and a plurality of scan signal output terminals, the second noise reduction circuit 700 also comprises a plurality of transistors correspondingly connected to the shift output terminals and/or the scan signal output terminals, so as to perform noise reduction on the shift output terminals and/or the scan signal output terminals.

For example, the output circuit 300 may be implemented as a fifteenth transistor M15, a sixteenth transistor M16, a seventeenth transistor M17, and a second capacitor C2. A gate electrode of the fifteenth transistor M15 is connected to the second node Q2, a first electrode of the fifteenth transistor M15 is connected to the fourth clock signal terminal CLKE to receive the fourth clock signal as an output signal, and a second electrode of the fifteenth transistor M15 is connected to the shift output terminal CR <N>. A gate electrode of the sixteenth transistor M16 is connected to the second node Q2, a first electrode of the sixteenth transistor M16 is connected to the fourth clock signal terminal CLKE to receive the fourth clock signal as the output signal, and a second electrode of the sixteenth transistor M16 is connected to the first scan signal output terminal OUT1 <N>. A gate electrode of the seventeenth transistor M17 is connected to the second node Q2, a first electrode of the seventeenth transistor M17 is connected to the fifth clock signal terminal CLKF to receive the fifth clock signal as the output signal, and a second electrode of the seventeenth transistor M17 is connected to the second scan signal output terminal OUT2 <N>. A first terminal of the second capacitor C2 is connected to the second node Q2, and a second terminal of the second capacitor C2 is connected to the shift output terminal CR <N>. For example, in this example, the output signals comprises the fourth clock signal and the fifth clock signal. It should be noted that, the present disclosure is not limited thereto, and may comprise more output signals and corresponding scan signal output terminals.

The charging sub-circuit 810 may be implemented as an eighteenth transistor M18. For example, a gate electrode of the eighteenth transistor M18 is connected to the sixth clock signal terminal CLKB to receive the sixth clock signal, a first electrode of the eighteenth transistor M18 is connected to the blanking control terminal STU2 to receive the second control signal, and a second electrode of the eighteenth transistor M18 is connected to the blanking node H. In a case where the sixth clock signal is at an active level (for example, a high level), the eighteenth transistor M18 is turned on, so that the blanking control terminal STU2 is electrically connected to the blanking node H, thereby writing the second control signal into the blanking node H. For example, in a case where the second control signal is at a high level, the blanking node H is charged.

The storage sub-circuit 820 may be implemented as a third capacitor C3. A first electrode of the third capacitor C3 is configured to be connected to the blanking node H, and a second electrode of the third capacitor C3 is configured to be connected to the second voltage terminal VGL1 to receive the second voltage. In a case where the high level of the second control signal is written to the blanking node H, the blanking node H is charged to a high level, the third capacitor C3 stores the high level and maintains the blanking node H at the high level for use in a subsequent phase.

It should be noted that, in the embodiments of the present disclosure, the third capacitor C3 can be a capacitor device manufactured by a technology process, for example, by fabricating special capacitor electrodes to implement the capacitor device, respective electrodes of a capacitor can be achieved by a metal layer, a semiconductor layer (for example, doped polysilicon), or the like, moreover, the third capacitor C3 may also be parasitic capacitors between respective devices, and can be implemented by the transistors themselves and other devices as well as wirings. The connection manner of the third capacitor C3 is not limited to the manner described above, and may be other suitable connection manners as long as the third capacitor C3 can store the level of the blanking node H. For example, in other examples, the first electrode of the third capacitor C3 is connected to the blanking node H, and the second electrode of the third capacitor C3 is connected to one terminal of the isolation sub-circuit 830 (for example, an eighth clock signal terminal CLKC described below); alternatively, the first electrode of the third capacitor C3 is connected to the blanking node H, and the second electrode of the third capacitor C3 is connected to a position (for example, a connection point between a second electrode of the nineteenth transistor M19 and a first electrode of the twentieth transistor M20 described below) in the isolation sub-circuit 830.

The isolation sub-circuit 830 may be implemented as a nineteenth transistor M19 and a twentieth transistor M20. For example, a gate electrode of the nineteenth transistor M19 is connected to the blanking node H, a first electrode of the nineteenth transistor M19 is connected to the eighth clock signal terminal CLKC to receive the eighth clock signal as the second input signal, a second electrode of the nineteenth transistor M19 is connected to a first electrode of the twentieth transistor M20, a gate electrode of the twentieth transistor M20 is connected to the seventh clock signal terminal CLKA to receive the seventh clock signal, and a second electrode of the twentieth transistor M20 is connected to the first node Q1. In a case where the blanking node H is at a high level and the seventh clock signal is also at a high level, the nineteenth transistor M19 and the twentieth transistor M20 are both turned on, so that the seventh clock signal terminal CLKC is electrically connected to the first node Q1, thereby writing the seventh clock signal to the first node Q1, and pulling up the potential of the first node Q1 to the operating potential.

The display reset circuit 910 may be implemented as a twenty-first transistor M21. A gate electrode of the twenty-first transistor M21 is connected to the display reset terminal STD to receive the display reset signal, a first electrode of the twenty-first transistor M21 is connected to the first node Q1, and a second electrode of the twenty-first transistor M21 is connected to the second voltage terminal VGL1 to receive the second voltage. For example, in a display period of one frame, in a case where the display reset signal is at an active level (for example, a high level), the twenty-first transistor M21 is turned on, so that the first node Q1 is electrically connected to the second voltage terminal VGL1, thereby resetting the first node Q1.

The blanking reset circuit 920 may be implemented as a twenty-second transistor M22. For example, a gate electrode of the twenty-second transistor M22 is connected to the sixth clock signal terminal CLKB (i.e., the blanking reset terminal RE) to receive the sixth clock signal as the blanking reset signal, a first electrode of the twenty-second transistor M22 is connected to the first node Q1, and a second electrode of the twenty-second transistor M22 is connected to the second voltage terminal VGL1 to receive the second voltage. For example, in a blanking period of one frame, in a case where the sixth clock signal is at an active level (e.g., a high level), the twenty-second transistor M22 is turned on, so that the first node Q1 is electrically connected to the second voltage terminal VGL1, thereby resetting the first node Q1.

In the embodiments of the present disclosure, for example, in a case where each circuit is implemented as N-type transistors, the term "pull-up" represents charging a node or an electrode of a transistor so as to raise an absolute value of the level of the node or the electrode, thereby implementing an operation (e.g., conduction) of the corresponding transistor; and the term "pull-down" represents discharging a node or an electrode of a transistor so as to decrease an absolute value of the level of the node or the electrode, thereby implementing an operation (e.g., turn-off) of the corresponding transistor.

For another example, in a case where each circuit is implemented as P-type transistors, the term "pull-up" represents discharging a node or an electrode of a transistor so as to decrease an absolute value of the level of the node or the electrode, thereby implementing the operation (e.g., conduction) of the corresponding transistor; and the term "pull-down" represents charging a node or an electrode of a transistor so as to raise an absolute value of the level of the node or the electrode, thereby implementing the operation (e.g., turn-off) of the corresponding transistor.

It should be noted that, in the description of each embodiment of the present disclosure, the first node Q1, the second node Q2, the third node Q3, the fourth node Q4, and the blanking node H may be conjunction points representing related electrical connections in the circuit diagram, may also be one wire, or a plurality of wires (having the same voltage) connected together, which is not limited in the embodiments of the present disclosure.

It should be noted that, transistors used in the embodiments of the present disclosure may be thin film transistors, field effect transistors, or other switching devices with the same characteristics, and the embodiments of the present disclosure are described by taking the thin film transistors as an example. A source electrode and a drain electrode of a transistor used herein may be symmetrical in structures, and therefore the source electrode and the drain electrode of the transistor may be indistinguishable in physical structures. In the embodiments of the present disclosure, in order to distinguish two electrodes of the transistor apart from a gate electrode, one of the two electrodes is directly referred to as a first electrode, and the other of the two electrodes is referred to as a second electrode.

In addition, the transistors in the embodiments of the present disclosure are described by taking N-type transistors as an example, in this case, the first electrode of the transistor is a drain electrode, and the second electrode is a source electrode. It should be noted that the present disclosure comprises but is not limited thereto. For example, one or more transistors in the shift register unit 10 provided by the embodiments of the present disclosure may also be P-type transistors, in this case, the first electrode of the transistor is a source electrode and the second electrode of the transistor is a drain electrode, so long as the respective electrodes of the selected type transistor are connected correspondingly with reference to the connection manner of the respective electrodes of the corresponding transistor in the embodiments of the present disclosure, and the corresponding voltage terminal is provided with a corresponding high voltage or low voltage. In a case where an N-type transistor is used, Iridium Gallium Zinc Oxide (IGZO) can be adopted as an active layer of a thin film transistor, compared to adopt low temperature poly silicon (LTPS) or amorphous silicon (for example, hydrogenation amorphous silicon) as an active layer of a thin film transistor, the size of the transistor can be effectively reduced and the leakage current can be prevented.

Figure 9:
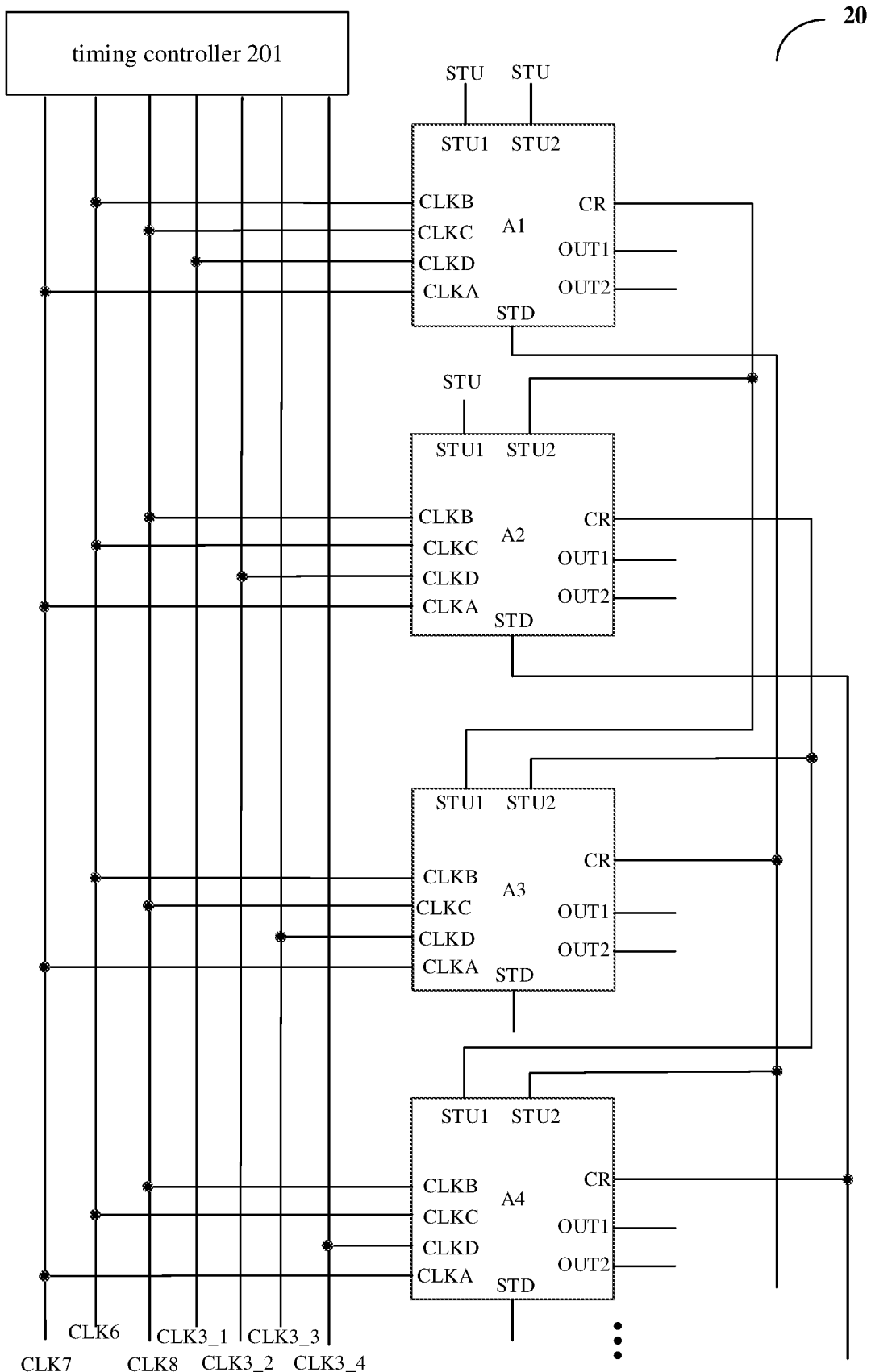
FIG. 9 is a schematic diagram of a gate driving circuit provided by at least one embodiment of the present disclosure.

An embodiment of the present disclosure provides a gate driving circuit 20, as shown in FIG. 9, the gate driving circuit 20 comprises a plurality of cascaded shift register units 10, and any one or more shift register units 10 in the gate driving circuit 20 may adopt the structure of the shift register unit 10 provided by the embodiments of the present disclosure or a modification of the shift register unit 10. It should be noted that, FIG. 9 only schematically shows first four stages of the shift register units (A1, A2, A3, and A4) of the gate driving circuit 20. For example, the gate driving circuit 20 can be directly integrated on an array substrate of the display device by using the same semiconductor manufacturing process as the thin film transistor, so as to achieve the progressive or interlaced scanning driving function.

As shown in FIG. 9, the gate driving circuit 20 further comprises a first clock signal line CLK1 (not shown in the figure for clarity and conciseness) connected to the first clock signal terminal CLKM, a second clock signal line CLK2 (not shown in the figure) connected to the second clock signal terminal CLKN, and four sub-clock signal lines CLK3_1-CLK3_4 providing the third clock signal. In a case where the shift register unit comprises a third clock signal terminal CLKD, a third clock signal terminal CLKD of a (4n−3)-th (n is an integer greater than zero) stage of shift register unit is connected to a first sub-clock signal line CLK3_1; a third clock signal terminal CLKD of a (4n−2)-th stage of shift register unit is connected to a second sub-clock signal line CLK3_2; a third clock signal terminal CLKD of a (4n−1)-th stage of shift register unit is connected to a third sub-clock signal line CLK3_3; and a third clock signal terminal CLKD of a (4n)-th stage of shift register unit is connected to a fourth sub-clock signal line CLK3_4.

As shown in FIG. 9, the gate driving circuit 20 may further comprise four sub-clock signal lines CLK4_1-CLK4_4 that provide the fourth clock signal and four sub-clock signal lines CLK5_1-CLK5_4 that provide the fifth clock signal (not shown in the figure for clarity and conciseness). In a case where the shift register unit comprises a fourth clock signal terminal CLKE, a connection manner of the four sub-clock signal lines CLK4_1-CLK4_4, which provide the fourth clock signal, and the fourth clock signal terminals CLKE is similar to a connection manner of the four sub-clock signal lines CLK3_1-CLK3_4, which provide the third clock signal, and the third clock signal terminals CLKD, and similar description is not repeated again. A connection manner of the four sub-clock signal lines CLK5_1-CLK5_4, which provide the fifth clock signal, and the fifth clock signal terminals CLKF is similar to the connection manner of the four sub-clock signal lines CLK3_1-CLK3_4, which provide the third clock signal, and the third clock signal terminals CLKD, and similar description is not repeated again. It should be noted that, in different examples, according to different configurations, more clock signal lines can be provided. For example, the number of sub-clock signal lines providing the third clock signal, the number of sub-clock signal lines providing the fourth clock signal, and the number of sub-clock signal lines providing the fifth clock signal may all be 6, 8, 10, and the like, respectively.

As shown in FIG. 9, the gate driving circuit 20 may further comprise a sixth clock signal line CLK6 and an eighth clock signal line CLK8. In a case where the shift register unit comprises a sixth clock signal terminal CLKB and an eighth clock signal terminal CLKC, a sixth clock signal terminal CLKB of a (2n−1)-th stage of shift register unit is connected to the sixth clock signal line CLK6, an eighth clock signal terminal CLKC of the (2n−1)-th stage of shift register unit is connected to the eighth clock signal line CLK8; a sixth clock signal terminal CLKB of a (2n)-th stage of shift register unit is connected to the eighth clock signal line CLK8, an eighth clock signal terminal CLKC of the (2n)-th stage of shift register unit is connected to the sixth clock signal line CLK6.

As shown in FIG. 9, the gate driving circuit 20 may further comprise a seventh clock signal line CLK7, and the seventh clock signal terminal CLKA of each stage of shift register unit is connected to the seventh clock signal line CLK7.

As shown in FIG. 9, each shift register unit comprises a display control terminal STU1, a blanking control terminal STU2, first to eighth clock signal terminals CLKA-CLKF, CLKM, CLKN, a display reset terminal STD, a shift output terminal CR, a first scan signal output terminal OUT1, a second scan signal output terminal OUT2, and so on. It should be noted that for clarity and conciseness, FIG. 9 does not show all clock signal terminals and clock signal lines connected to the clock signal terminals.

A display control terminal STU1 and a blanking control terminal STU2 of a first stage of shift register unit, and a display control terminal STU1 of a second stage of shift register unit are all connected to a trigger signal line STU, for example, to receive a trigger signal STV. For example, in addition to the first stage of shift register unit, the blanking control terminal STU2 of an (n+1)-th stage of shift register unit is connected to the shift output terminal CR of an n-th stage of shift register unit. For example, in addition to the first stage of shift register unit and the second stage of shift register unit, the display control terminal STU1 of an (n+2)-th stage of shift register unit is connected to the shift output terminal CR of the n-th stage of shift register unit. For example, in addition to last two stages of the shift register units, the display reset terminal STD of each stage of shift register unit is connected to the shift output terminal CR of a shift register unit which is separated from each stage of shift register unit by one stage of shift register unit. For example, the display reset terminals STD of the last two stages of the shift register units are connected to a reset line (not shown in the figure) to receive a reset signal.

For example, the gate driving circuit 20 may further comprise a timing controller 201. The timing controller 201 is configured, for example, to provide the above-mentioned clock signals to the shift register units, and the timing controller 201 may also be configured to provide a trigger signal and a reset signal. It should be noted that, a phase relationship among the plurality of clock signals provided by the timing controller 201 may be determined according to actual requirements.

For example, the gate driving circuit 20 further comprises a plurality of voltage lines to provide a plurality of voltage signals, including, for example, a high level signal VDD, low level signals VGL1 and VGL2, and the like, to the shift register units.

For example, in a case where the gate driving circuit 20 is used to drive a display panel, the gate driving circuit 20 may be disposed on one side of the display panel. For example, the display panel comprises a plurality of rows of gate lines. The first scan signal output terminals OUT1 and the second scan signal terminals OUT2 of the respective stages of shift register units of the gate driving circuit 20 may be configured to be sequentially connected to the plurality of rows of gate lines for outputting the driving signals. Certainly, the gate driving circuit 20 can also be provided on both sides of the display panel to achieve bilateral driving. The embodiments of the present disclosure do not limit the arrangement manner of the gate driving circuit 20. For example, a gate driving circuit 20 may be provided on one side of the display panel for driving odd-numbered rows of the gate lines, and a gate driving circuit 20 may be provided on the other side of the display panel for driving even-numbered rows of the gate lines.

Figure 10:
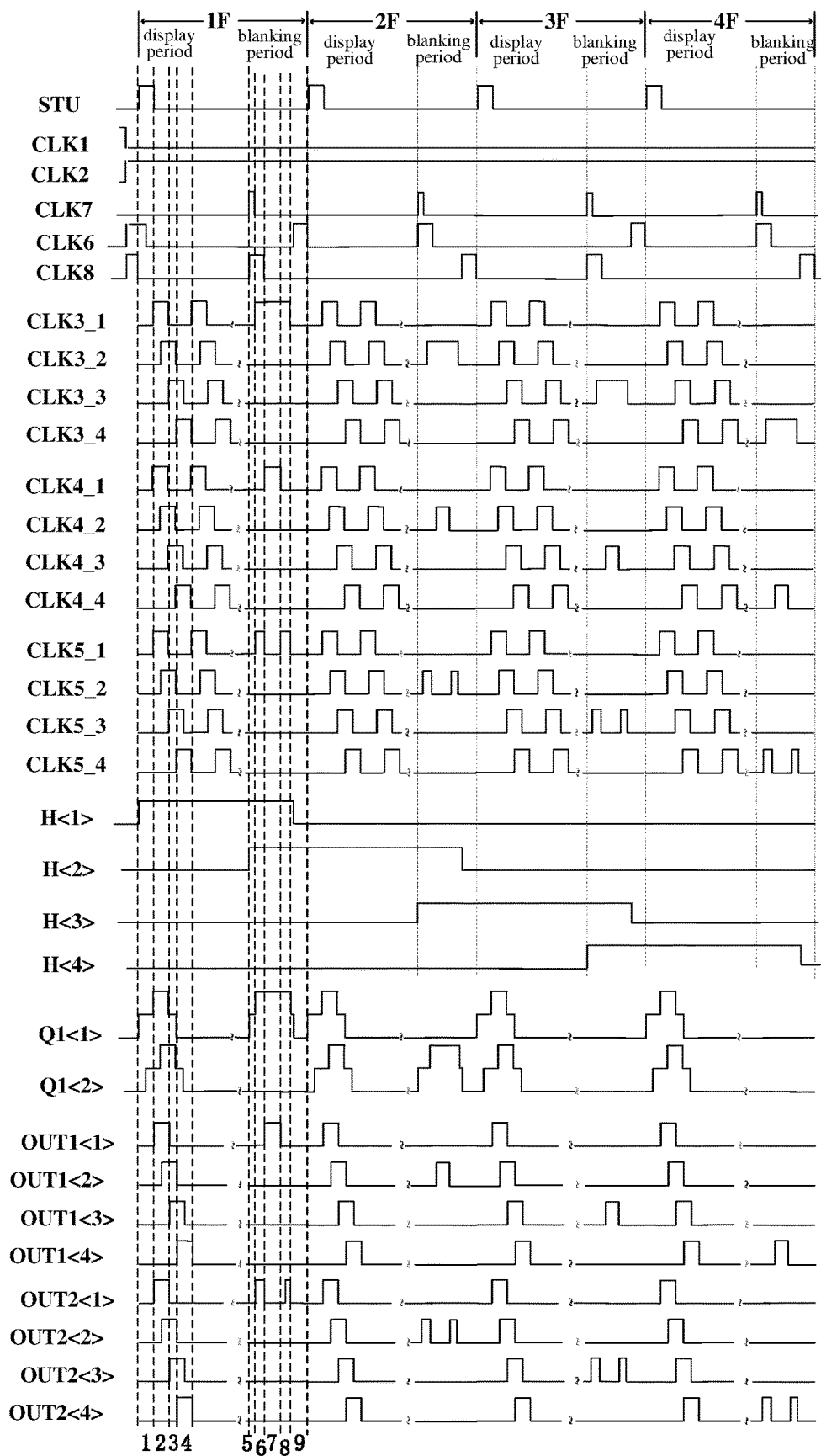
FIG. 10 is a signal timing diagram corresponding to the gate driving circuit as shown in FIG. 9 when the gate driving circuit operates provided by at least one embodiment of the present disclosure.

FIG. 10 is a signal timing diagram of a gate driving circuit according to at least one embodiment of the present disclosure. For example, the timing of the clock signals provided by the clock signal lines CLK1-CLK8 of the gate driving circuit as shown in FIG. 9 may adopt the signal timing as shown in FIG. 10, so as to implement a function of the gate driving circuit 20 outputting the gate scan signals line by line.

In FIGS. 10, Q1 <1> and Q1 <2> represent the first node in the first stage of shift register unit and the first node in the second stage of shift register unit in the gate driving circuit 20, respectively. Similarly, the suffix "<N>" represents the N-th stage of shift register unit in the gate driving circuit 20, accordingly, OUT1 <1>, OUT1 <2>, OUT1 <3>, and OUT1 <4> represent the first scan signal output terminal of the first stage of shift register unit, the first scan signal output terminal of the second stage of shift register unit, the first scan signal output terminal of the third stage of shift register unit, and the first scan signal output terminal of the fourth stage of shift register unit in the gate driving circuit 20, respectively. OUT2 <1>, OUT2 <2>, OUT2 <3>, and OUT2 <4> represent the second scan signal output terminal of the first stage of shift register unit, the second scan signal output terminal of the second stage of shift register unit, the second scan signal output terminal of the third stage of shift register unit, and the second scan signal output terminal of the fourth stage of shift register unit in the gate driving circuit 20, respectively. 1F, 2F, 3F, and 4F represent a first frame, a second frame, a third frame, and a fourth frame, respectively. It should be noted that, for clarity and conciseness, because the potential of the shift output terminal CR and the potential of the first scan signal output terminal OUT1 in each stage of the shift register units are the same, the shift output terminal CR is not shown in FIG. 10.

It should be noted that the signal levels in the signal timing diagram as shown in FIG. 10 are only schematic and do not represent the true level values.

A working principle of the gate driving circuit 20 as shown in FIG. 9 will be described below with reference to the signal timing diagram as shown in FIG. 10.

The sixth clock signal terminals CLKB of the shift register units 10 in the odd-numbered row are connected to the sixth clock signal line CLK6, and the sixth clock signal terminals CLKB of the shift register units 10 in the even-numbered row are connected to the eighth clock signal line CLK8. Referring to FIG. 10, the sixth clock signal line CLK6 and the eighth clock signal line CLK8 are alternately at a high level at the terminal of the blanking period of each frame, so as to input the high level to the sixth clock signal terminals CLKB of the shift register units 10 in the odd-numbered row and the sixth clock signal terminals CLKB of the shift register units 10 in the even-numbered row, alternately, thereby alternately resetting the blanking nodes H and the first nodes Q1 of the shift register units 10 in the odd-numbered row and the blanking nodes H and the first nodes Q1 of the shift register units 10 in the even-numbered row. In a case where the sixth clock signal terminals CLKB of the shift register units 10 in an n-th row are at a high level, the eighth clock signal terminals CLKC of the shift register units 10 in an (n+1)-th row are at a high level, in this case, the seventh clock signal terminal CLKA is at a low level, so that the twentieth transistor M20 is turned off, and therefore, the levels of the first nodes Q1 of the shift register units 10 in the (n+1)-th row will not be changed to a high level due to the high level of the eighth clock signal terminal CLKC, thereby avoiding the occurrence of abnormal output.

In a display period of a first frame 1F, the working process of the first stage of shift register unit is described as follows.

In a first phase 1, a display control terminal STU1 and a blanking control terminal STU2 of the first stage of shift register unit are both connected to the trigger signal line STU, so at the beginning of the first phase 1, a high level is input to both the display control terminal STU1 and the blanking control terminal STU2. At the same time, because a high level is input to the sixth clock signal terminal CLKB (connected to the sixth clock signal line CLK6), the eighteenth transistor M18 is turned on, and the blanking node H is charged to a high level and the high level is stored by the third capacitor C3.

Moreover, the first transistor M1 is turned on due to the high level input to the display control terminal STU1, so that the high level signal of the first voltage terminal VDD can charge the first node Q1 through the first transistor M1, and thus, the first node Q1 is pulled up to a high potential and the high potential is stored by the first capacitor C1. The seventh transistor M7 is turned on under control of the level of the first node Q1, however, because a low level signal is input to the third clock signal terminal CLKD (connected to the first sub-clock signal line CLK3_1) at this time, the potential of the second node Q2 is a low level at this time.

Because the second node Q2 is at a low level, the fifteenth transistor M15, the sixteenth transistor M16, and the seventeenth transistor M17 are turned off, the shift output terminal CR, the first scan signal output terminal OUT1 <1>, and the second scan signal output terminal OUT2 <1> are all at a low level.

In a second phase 2, a high level signal is input to the third clock signal terminal CLKD, the fourth clock signal terminal CLKE (connected to the sub-clock signal line CLK4_1), and the fifth clock signal terminal CLKF (connected to the sub-clock signal line CLK5_1), the potential of the first node Q1 is further pulled up due to the bootstrap effect, so the seventh transistor M7 is still turned on, therefore, the high level provided by the third clock signal terminal CLKD can charge the second node Q2 through the seventh transistor M7, so that the second node Q2 is pulled up to a high potential and the high potential is stored by the second capacitor C2. The fifteenth transistor M15, the sixteenth transistor M16, and the seventeenth transistor M17 are turned on under control of the level of the second node Q2, so the shift output terminal CR, the first scan signal output terminal OUT1 <1>, and the second scan signal output terminal OUT2 <1> all output high level signals. For example, a high level signal output from the shift output terminal CR can be used for the scan shift of a previous stage of shift register unit and a next stage of shift register unit, while high level signals output from the first scanning signal output terminal OUT1 <1> and the second scanning signal output terminal OUT2 <1> can be used to drive a sub-pixel unit in a display panel for display.

In a third phase 3, a low level signal is input to the third clock signal terminal CLKD, the fourth clock signal terminal CLKE, and the fifth clock signal terminal CLKF, the shift output terminal CR and the first scan signal output terminal OUT1 <1> are discharged through the fourth clock signal terminal CLKE, the second scan signal output terminal OUT2 <1> is discharged through the fifth clock signal terminal CLKF, thereby completing resetting the shift output terminal CR, the first scan signal output terminal OUT1 <1>, and the second scan signal output terminal OUT2 <1>. Because the shift output terminal CR, the first scan signal output terminal OUT1 <1>, and the second scan signal output terminal OUT2 <1> are reset to a low level, through the coupling effect between the transistors, the potential of the second node Q2 changes, and also through the coupling effect between the transistors, the potential of the first node Q1 decreases to some extent; at the same time, because the display reset terminal STD of the first stage of shift register unit A1 is connected to the shift output terminal CR of the fourth stage of shift register unit, at this time, the shift output terminal CR of the fourth stage of shift register unit A4 has not yet output a high level signal, so the first node Q1 will not be pulled down, so that the first node Q1 can be maintained at a relatively high level.

In a fourth phase 4, the shift output terminal CR, the first scan signal output terminal OUT1 <1>, and the second scan signal output terminal OUT2 <1> of the fourth stage of shift register unit A4 output high levels, so that a high level signal is input to the display reset terminal STD of the first stage of shift register unit A1, the twenty-first transistor M21 is turned on, and the first node Q1 is pulled down to a low level to complete resetting the first node Q1.

Through the above-mentioned process, the potential change of the first node Q1 of the first stage of shift register unit A1 presents a "tower shape". The pull-up and reset of the output signal of the shift output terminal CR are implemented by the fifteenth transistor M15, the pull-up and reset of the output signal of the first scan signal output terminal OUT1 are implemented by the sixteenth transistor M16, the pull-up and reset of the output signal of the second scan signal output terminal OUT2 are implemented by the seventeenth transistor M17, the twelfth transistor M12, the thirteenth transistor M13, and the fourteenth transistor M14 are used to assist in pulling down the output signal of the shift output terminal CR, the output signal of the first scan signal output terminal OUT1 <1>, and the output signal of the second scan signal output terminal OUT2 <1>, respectively. Therefore, the size of the twelfth transistor M12, the size of the thirteenth transistor M13, and the size of the fourteenth transistor M14 can be reduced, which is beneficial to reducing the area of the circuit layout.

In the above display period of the first frame, because the seventh clock signal terminal CLKA (connected to the seventh sub-clock signal line CLK7) is always kept at a low level, the twentieth transistor M20 remains in a turn-off state, so the twentieth transistor M20 isolates the influence of the pre-stored high level at the blanking node H on the display period (for example, the influence on the level of the first node Q1).

After the first stage of shift register unit A1 drives sub-pixel units in the first row in the display panel to complete the display, by analogy, shift register units, such as the second stage of shift register unit and the third stage of shift register unit, drive the sub-pixel units in the display panel line by line, so as to complete the display drive for one frame. Thus, the display period of the first frame ends.

In a blanking period of the first frame 1F, the working process of the first stage of shift register unit is described as follows.

In a fifth phase 5, the blanking node H maintains the high level of the display period due to the storage effect of the third capacitor C3, at the beginning of the fifth phase 5, a high level signal is input to the seventh clock signal terminal CLKA (connected to the seventh sub-clock signal line CLK7) and the eighth clock signal terminal CLKC (connected to the eighth clock signal line CLK8), the nineteenth transistor M19 and the twentieth transistor M20 are turned on, so that the high level of the eighth clock signal terminal CLKC can charge the first node Q1, thereby pulling up the first node Q1 to a high potential. The fourth transistor M4 is turned on under control of the first node Q1, and the third node Q3 is pulled down to a low level.

In a sixth phase 6, a low level signal is input to the seventh clock signal terminal CLKA, and the twentieth transistor M20 is turned off. A high level signal is input to the third clock signal terminal CLKD (connected to the first sub-clock signal line CLK3_1), a low level signal is input to the fourth clock signal terminal CLKE (connected to the sub-clock signal line CLK4_1), a high level signal is input to the fifth clock signal terminal CLKF (connected to the sub-clock signal line CLK5_1), the potential of the first node Q1 is further pulled up due to the bootstrap effect of the first capacitor C1, the seventh transistor M7 is turned on, the second node Q2 is at a high level of the third clock signal, the fifteenth transistor M15 to the seventeenth transistor M17 are turned on, and the high level signal input to the fifth clock signal terminal CLKF can be output to the second scan signal output terminal OUT2 <1>. For example, the signals output from the scan signal output terminals (the first scan signal output terminal OUT1 <1> and the second scan signal output terminal OUT2 <1>) can be used to drive sense transistors in the sub-pixel units in the display panel to achieve external compensation.

At the same time, because the sixth clock signal terminal CLKB of the second stage of shift register unit A2 is connected to the eighth clock signal line CLK8, and the blanking control terminal STU2 of the second stage of shift register unit A2 is connected to the shift output terminal CR of the first stage of shift register unit A1, the eighteenth transistor M18 in the second stage of shift register unit is turned on, so that the blanking node H <2> in the second stage of shift register unit A2 is pulled up to a high level.

In a seventh phase 7, after the blanking node H <2> in the second stage of shift register unit A2 is sufficiently written to a high potential, a low level signal is input to the eighth clock signal line CLK8. At the same time, a high level continues to be input to the third clock signal terminal CLKD, so the second node Q2 remains at a high level, because the fourth clock signal terminal CLKE inputs a high level and the fifth clock signal terminal CLKF inputs a low level, the shift output terminal CR and the first scan signal output terminal OUT1 <1> of the first stage of shift register unit A1 output high level signals, and the second scan signal output terminal OUT2 <1> of the first stage of shift register unit A1 outputs a low level signal. During this process, the twentieth transistor M20 is always kept to be turned off, so the first node Q1 <1> can be prevented from leaking electricity through the twentieth transistor M20.

In an eighth phase 8, a high level continues to be input to the third clock signal terminal CLKD, so the second node Q2 remains at a high level, because a low level is input to the fourth clock signal terminal CLKE and a high level is input to the fifth clock signal terminal CLKF, the shift output terminal CR and the first scan signal output terminal OUT1 <1> of the first stage of shift register unit A1 output low level signals, and the second scan signal output terminal OUT2 <1> of the first stage of shift register unit A1 outputs a high level signal.

It can be known from the seventh phase 7 and the eighth phase 8 that the first stage of shift register unit A1 can output a plurality of output signals with different pulses at the plurality of scan signal output terminals, respectively. Because the plurality of output signals with different pulses are controlled by the level of the second node Q2 (i.e., the third clock signal), no abnormal output phenomenon occurs.

In a ninth phase 9, that is, the last phase of the blanking period, a high level signal is input to the sixth clock signal line CLK6, because the sixth clock signal terminals CLKB of the odd-numbered stage of shift register units are connected to the sixth clock signal line CLK6, the resetting of the blanking nodes H and the first nodes Q1 in all odd-numbered stage of shift register units can be completed, in particular, the first node Q1 of the first stage of shift register unit, the first node Q1 of the third stage of shift register unit, and the blanking node H of the first stage of shift register unit are reset. Because the threshold voltage of the transistor may drift positively in a case where a positive voltage is applied to the transistor, by adopting the above-mentioned method, the time during which the blanking node H needs to be maintained at a positive voltage is shorter, thereby reducing the time during which the threshold voltage of the transistor is drifted positively, and improving the reliability of the transistor.

So far, the driving timing of the first frame ends.

In a display period of a second frame, the gate driving circuit 20 repeats the same operation as the display period of the first frame, and similar description is not repeated here.

In a blanking period of the second frame, for the second stage of shift register unit A2, because the eighth clock signal terminal CLKC is connected to the sixth clock signal line CLK6, at the beginning of the blanking period, a high level signal is input to the seventh clock signal terminal CLKA and the eighth clock signal terminal CLKC of the second stage of shift register unit, the nineteenth transistor M19 and the twentieth transistor M20 are turned on, so that the high level input to the eighth clock signal terminal CLKC can charge the first node Q1 and pull up the first node Q1 to a high potential. Then, in a case where a high level signal is input to the second sub-clock signal line CLK3_2, the shift output terminal CR, the first scan signal output terminal OUT1, and the second scan signal output terminal output high level signals, at the same time, the blanking node H in the third stage of shift register unit A3 is charged. In the last phase of the blanking period of the second frame, a high level signal is input to the eighth clock signal line CLK8, because the sixth clock signal terminals CLKB of the even-numbered stage of shift register units are connected to the eighth clock signal line CLK8, the resetting of the blanking nodes H and the first nodes Q1 in all the even-numbered stage of shift register units can be completed.

So far, the driving timing of the second frame ends. The subsequent driving of the gate driving circuit in a third frame, a fourth frame, a fifth frame, and the like, may refer to the above description, and details are not described herein again.

As described above, during the blanking period of each frame, the gate driving circuit outputs driving signals for sense transistors in sub-pixel units in a display panel, and the driving signals are sequentially provided row by row. For example, in the blanking period of the first frame, the gate driving circuit outputs a driving signal for sub-pixel units in a first row of the display panel, in the blanking period of the second frame, the gate driving circuit outputs a driving signal for sub-pixel units in a second row of the display panel, and so on, so as to complete the sequential progressive compensation.

As shown in FIG. 10, a waveform of the first sub-clock signal line CLK3_1, a waveform of the second sub-clock signal line CLK3_2, a waveform of the third sub-clock signal line CLK3_3, and a waveform of the fourth sub-clock signal line CLK3_4 in the display period of one frame are sequentially overlapped by 50% of the effective pulse width, the waveforms in the blanking period of each frame are sequentially shifted. The output signals of the first scan signal output terminals OUT1 of the first to fourth stage of shift register units A1-A4 in the display period of one frame are sequentially overlapped by 50% of the effective pulse width, the output signals of the second scan signal output terminals OUT2 of the first to fourth stage of shift register units A1-A4 in the display period of one frame are sequentially overlapped by 50% of the effective pulse width, and the waveforms in the blanking period of each frame are sequentially shifted. The output signals of the gate driving circuit 20 in the display period overlap, so that the pre-charging function can be achieved, the charging time of the pixel circuit can be shortened, which is beneficial to achieve a high refresh rate.

It should be noted that, in each embodiment of the present disclosure, the gate driving circuit 20 is not limited to a cascading manner described in FIG. 9, and may have any suitable cascading manner. In a case where the cascading manner or the clock signal is changed, the waveform overlapping portions of the output signals of the first scan signal terminals OUT1 of the first stage of shift register unit to the fourth stage of shift register unit A1-A4 in the display period also change accordingly, the waveform overlapping portions of the output signals of the second scan signal terminals OUT2 of the first stage of shift register unit to the fourth stage of shift register unit A1-A4 in the display period also change accordingly, for example, overlapping by 33% or 0% (i.e., non-overlapping), to meet requirements of various applications.

Figure 11:
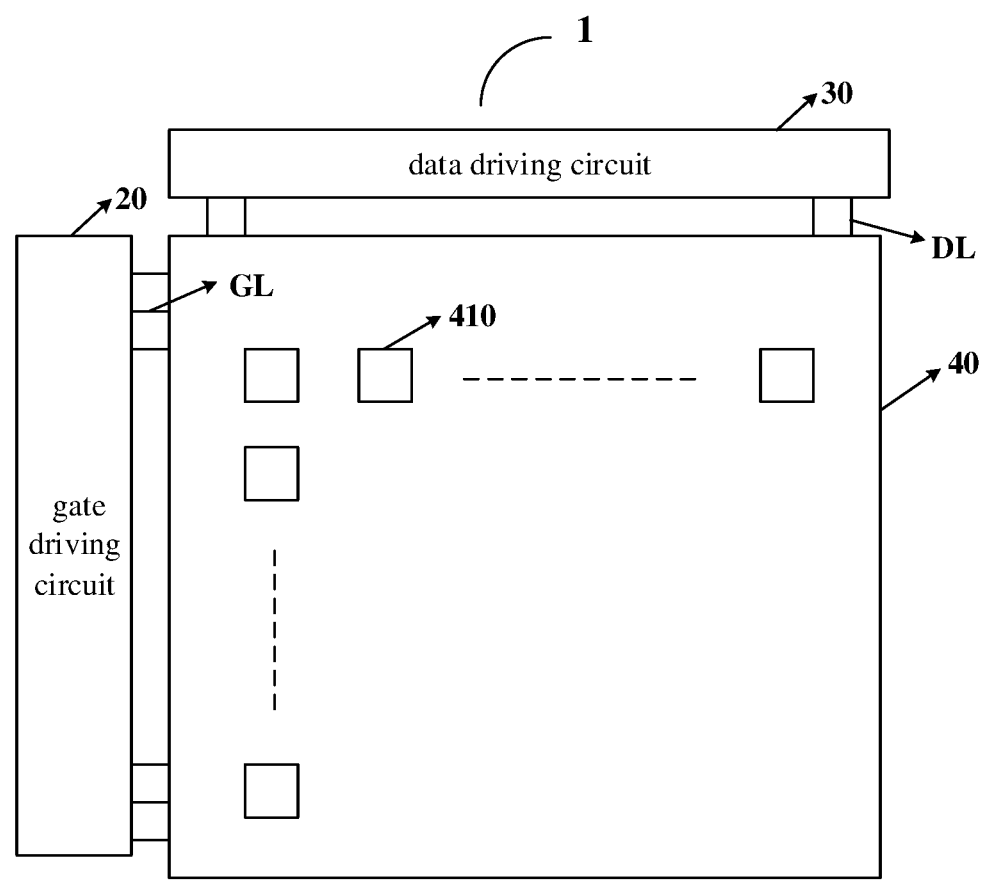
FIG. 11 is a schematic diagram of a display device provided by at least one embodiment of the present disclosure.

At least one embodiment of the present disclosure also provides a display device. As shown in FIG. 11, the display device 1 comprises a gate driving circuit 20 provided by the above embodiments of the present disclosure. The display device 1 further comprises a display panel 40, and the display panel 40 comprises an array including a plurality of sub-pixel units 410. For example, the display device 1 may further comprise a data driving circuit 30. The data driving circuit 30 is used to provide data signals to the pixel array; and the gate driving circuit 20 is used to provide driving signals to the pixel array, for example, the driving signals may drive the scan transistors and the sense transistors in the sub-pixel units 410. The data driving circuit 30 is electrically connected to the sub-pixel units 410 through data lines DL, and the gate driving circuit 20 is electrically connected to the sub-pixel units 410 through gate lines GL.

It should be noted that the display device 1 in the embodiments may be a liquid crystal panel, a liquid crystal television, a display, an OLED panel, an OLED television, an electronic paper display device, a mobile phone, a tablet computer, a notebook computer, a digital photo frame, a navigator, or any product or component having a display function.

Technical effects of the display device 1 provided by the embodiments of the present disclosure may refer to the corresponding descriptions of the gate driving circuit 20 in the above embodiments, and details are not described herein again.

At least an embodiment of the present disclosure also provides a driving method that can be used to drive the shift register unit 10 provided by the embodiment of the present disclosure. The driving method comprises the following operations.

In a first phase, in response to the first control signal, inputting the first input signal to the first node Q1 through the first input circuit 100.

In a second phase, outputting the output control signal to the second node Q2 under control of the level of the first node Q1.

In a third phase, outputting the output signal to the output terminal OUT under control of the level of the second node Q2.

Technical effects of the driving method of the shift register unit 10 provided by the embodiment of the present disclosure may refer to the corresponding description of the shift register unit 10 in the above embodiments, and details are not described herein again.

The following statements should be noted:

(1) The accompanying drawings involve only the structure(s) in connection with the embodiment(s) of the present disclosure, and other structure(s) can be referred to common design(s).

(2) In case of no conflict, the embodiments of the present disclosure and the features in the embodiment(s) can be combined with each other to obtain new embodiment(s).

What have been described above are only exemplary implementations of the present disclosure, and are not intended to limit the protection scope of the present disclosure. Therefore, the protection scope of the present disclosure is determined by the appended claims.

What is claimed is:

1. A shift register unit, comprising a first input circut, an output control circuit, an output circuit, a fourth node control circuit, and a second noise reduction circuit:
    wherein the first input circuit is connected to a first node, and is configured to output a first input signal to the first node in response to a first control signal;
    the output control circuit is connected to the first node and a second node, and is configured to output an output control signal to the second node under control of a level of the first node;
    the output circuit comprises an output an output terminal, and the output circuit is connected to the second node, and is configured to output an output signal to the output termnal under control of a level of the second node;
    the fourth node control circuit is connected to the second node and a fourth node, and is configured to control a level of the fourth node under control of the level of the second node; and
    the second noise reduction circuit is connected to the second node, the fourth node, and the output terminal, and is configured to perform noise reduction on the second node and the output terminal under control of the level of the fourth node;
    wherein the output terminal comprises a shift output terminal and at least one scan signal output terminal;
    wherein the at least one scan signal output terminal comprises a first scan signal output terminal and a second scan signal output terminal, and the second noise reduction circuit comprises an eleventh transistor, a twelfth transistor, a thirteenth transistor, and a fourteenth transistor;
    a gate electrode of the eleventh transistor is connected to the fourth node, a first electrode of the eleventh transistor is connected to the second node, and a second electrode of the eleventh transistor is connected to a second voltage terminal to receive a second voltage;
    a gate electrode of the twelfth transistor is connected to the fourth node, a first electrode of the twelfth transistor is connected to the shift output terminal, and a second electrode of the twelfth transistor is connected to the second voltage terminal to receive the second voltage;
    a gate electrode of the thirteenth transistor is connected to the fourth node, a first electrode of the thirteenth transistor is connected to the first scan signal output terminal, and a second electrode of the thirteenth transistor is connected to a third voltage terminal to receive a third voltage; and
    a gate electrode of the fourteenth transistor is connected to the fourth node, a first electrode of the fourteenth transistor is connected to the second scan signal output terminal, and a second electrode of the fourteenth transistor is connected to the third voltage terminal to receive the third voltage.

2. The shift register unit according to claim 1, further comprising a third node control circuit,
    wherein the third node control circuit is connected to the first node and a third node, and is configured to control a level of the third node under control of the level of the first node.

3. The shift register unit according to claim 2, further comprising a first noise reduction circuit,
    wherein the first noise reduction circuit is connected to the first node, the second node, and the third node, and is configured to perform noise reduction on the first node and the second node under control of the level of the third node.

4. The shift register unit according to claim 1, wherein the first input circuit comprises a first transistor,
    a gate electrode of the first transistor is connected to a display control terminal to receive the first control signal, a first electrode of the first transistor is connected to a first voltage terminal to receive a first voltage as the first input signal, and a second electrode of the first transistor is connected to the first node.

5. The shift register unit according to claim 2, wherein the third node control circuit comprises a second transistor, a third transistor, and a fourth transistor;
    a gate electrode and a first electrode of the second transistor are connected to each other, and are connected to a first clock signal terminal to receive a first clock signal, and a second electrode of the second transistor is connected to the third node;
    a gate electrode and a first electrode of the third transistor are connected to each other, and are connected to a second clock signal terminal to receive a second clock signal, and a second electrode of the third transistor is connected to the third node; and
    a gate electrode of the fourth transistor is connected to the first node, a first electrode of the fourth transistor is connected to the third node, and a second electrode of the fourth transistor is connected to the second voltage terminal to receive the second voltage.

6. The shift register unit according to claim 3, wherein the first noise reduction circuit comprises a fifth transistor and a sixth transistor;
    a gate electrode of the fifth transistor is connected to the third node, a first electrode of the fifth transistor is connected to the first node, and a second electrode of the fifth transistor is connected to the second voltage terminal to receive the second voltage; and
    a gate electrode of the sixth transistor is connected to the third node, a first electrode of the sixth transistor is connected to the second node, and a second electrode of the sixth transistor is connected to the second voltage terminal to receive the second voltage.

7. The shift register unit according to claim 1, wherein the output control circuit comprises a seventh transistor and a first capacitor;
    a gate electrode of the seventh transistor is connected to the first node, a first electrode of the seventh transistor is connected to a third clock signal terminal to receive a third clock signal as the output control signal, and a second electrode of the seventh transistor is connected to the second node; and
    a first terminal of the first capacitor is connected to the first node, and a second terminal of the first capacitor is connected to the second node.

8. The shift register unit according to claim 1, wherein the fourth node control circuit comprises an eighth transistor, a ninth transistor, and a tenth transistor;
- a gate electrode and a first electrode of the eighth transistor are connected to each other, and are connected to a first clock signal terminal to receive a first clock signal, and a second electrode of the eighth transistor is connected to the fourth node;
- a gate electrode and a first electrode of the ninth transistor are connected to each other, and are connected to a second clock signal terminal to receive a second clock signal, and a second electrode of the ninth transistor is connected to the fourth node; and
- a gate electrode of the tenth transistor is connected to the second node, a first electrode of the tenth transistor is connected to the fourth node, and a second electrode of the tenth transistor is connected to the second voltage terminal to receive the second voltage.

9. The shift register unit according to claim 1, wherein the output circuit comprises a fifteenth transistor, a sixteenth transistor, a seventeenth transistor, and a second capacitor;
- a gate electrode of the fifteenth transistor is connected to the second node, a first electrode of the fifteenth transistor is connected to a fourth clock signal terminal to receive a fourth clock signal as the output signal, and a second electrode of the fifteenth transistor is connected to the shift output terminal;
- a gate electrode of the sixteenth transistor is connected to the second node, and a first electrode of the sixteenth transistor is connected to the fourth clock signal terminal to receive the fourth clock signal as the output signal, and a second electrode of the sixteenth transistor is connected to the first scan signal output terminal;
- a gate electrode of the seventeenth transistor is connected to the second node, and a first electrode of the seventeenth transistor is connected to a fifth clock signal terminal to receive a fifth clock signal as the output signal, and a second electrode of the seventeenth transistor is connected to the second scan signal output terminal; and
- a first terminal of the second capacitor is connected to the second node, and a second terminal of the second capacitor is connected to the shift output terminal.

10. The shift register unit according to claim 1, further comprising a second input circuit,
- wherein the second input circuit is connected to the first node, and is configured to input a second input signal to the first node according to a second control signal;
- the second input circuit comprises a charging sub-circuit, a storage sub-circuit, and an isolation sub-circuit;
- the charging sub-circuit is connected to a blanking node, and is configured to input the second control signal to the blanking node in response to a sixth clock signal;
- the storage sub-circuit is connected to the blanking node, and is configured to store a level of the second control signal input by the charging sub-circuit; and
- the isolation sub-circuit is connected to the blanking node and the first node, and is configured to input the second input signal to the first node under control of a level of the blanking node and a seventh clock signal;
- the charging sub-circuit comprises an eighteenth transistor, a gate electrode of the eighteenth transistor is connected to a sixth clock signal terminal to receive the sixth clock signal, a first electrode of the eighteenth transistor is connected to a blanking control terminal to receive the second control signal, and a second electrode of the eighteenth transistor is connected to the blanking node;
- the storage sub-circuit comprises a third capacitor, a first terminal of the third capacitor is connected to the blanking node, and a second terminal of the third capacitor is connected to the second voltage terminal to receive the second voltage; and
- the isolation sub-circuit comprises a nineteenth transistor and a twentieth transistor, a gate electrode of the nineteenth transistor is connected to the blanking node, a first electrode of the nineteenth transistor is connected to an eighth clock signal terminal to receive an eighth clock signal as the second input signal, and a second electrode of the nineteenth transistor is connected to a first electrode of the twentieth transistor, a gate electrode of the twentieth transistor is connected to a seventh clock signal terminal to receive the seventh clock signal, and a second electrode of the twentieth transistor is connected to the first node.

11. The shift register unit according to claim 1, further comprising a display reset circuit,
- wherein the display reset circuit is connected to the first node, and is configured to reset the first node in response to a display reset signal;
- the display reset circuit comprises a twenty-first transistor; and
- a gate electrode of the twenty-first transistor is connected to a display reset terminal to receive the display reset signal, a first electrode of the twenty-first transistor is connected to the first node, and a second electrode of the twenty-first transistor is connected to the second voltage terminal to receive the second voltage.

12. The shift register unit according to claim 10, further comprising a blanking reset circuit,
- wherein the blanking reset circuit is connected to the first node, and is configured to reset the first node in response to a blanking reset signal;
- the blanking reset circuit comprises a twenty-second transistor; and
- a gate electrode of the twenty-second transistor is connected to the sixth clock signal terminal to receive the sixth clock signal as the blanking reset signal, and a first electrode of the twenty-second transistor is connected to the first node, and a second electrode of the twenty-second transistor is connected to the second voltage terminal to receive the second voltage.

13. The shift register unit according to claim 1, further comprising a third node control circuit, a first noise reduction circuit, a second input circuit, a display reset circuit, and a blanking reset circuit,
- wherein the first input circuit comprises a first transistor, a gate electrode of the first transistor is connected to a display control terminal to receive the first control signal, a first electrode of the first transistor is connected to a first voltage terminal to receive a first voltage as the first input signal, and a second electrode of the first transistor is connected to the first node;
- the third node control circuit comprises a second transistor, a third transistor, and a fourth transistor, a gate electrode and a first electrode of the second transistor are connected to each other and are connected to a first clock signal terminal to receive a first clock signal, a second electrode of the second transistor is connected to a third node, a gate electrode and a first electrode of the third transistor are connected to each other and are connected to a second clock signal terminal to receive a second clock signal, a second electrode of the third transistor is connected to the third node, a gate electrode of the fourth transistor is connected to the first node, a first electrode of the fourth transistor is connected to the third node, and a second electrode of the fourth transistor is connected to the second voltage terminal to receive the second voltage;

the first noise reduction circuit comprises a fifth transistor and a sixth transistor, a gate electrode of the fifth transistor is connected to the third node, a first electrode of the fifth transistor is connected to the first node, and a second electrode of the fifth transistor is connected to the second voltage terminal to receive the second voltage, a gate electrode of the sixth transistor is connected to the third node, and a first electrode of the sixth transistor is connected to the second node, and a second electrode of the sixth transistor is connected to the second voltage terminal to receive the second voltage;

the output control circuit comprises a seventh transistor and a first capacitor, a gate electrode of the seventh transistor is connected to the first node, a first electrode of the seventh transistor is connected to a third clock signal terminal to receive a third clock signal as the output control signal, a second electrode of the seventh transistor is connected to the second node, a first terminal of the first capacitor is connected to the first node, and a second terminal of the first capacitor is connected to the second node;

the fourth node control circuit comprises an eighth transistor, a ninth transistor, and a tenth transistor, a gate electrode and a first electrode of the eighth transistor are connected to each other and are connected to the first clock signal terminal to receive the first clock signal, a second electrode of the eighth transistor is connected to the fourth node, a gate electrode and a first electrode of the ninth transistor are connected to each other and are connected to the second clock signal terminal to receive the second clock signal, a second electrode of the ninth transistor is connected to the fourth node, and a gate electrode of the tenth transistor is connected to the second node, a first electrode of the tenth transistor is connected to the fourth node, and a second electrode of the tenth transistor is connected to the second voltage terminal to receive the second voltage;

the output circuit comprises a fifteenth transistor, a sixteenth transistor, a seventeenth transistor, and a second capacitor, a gate electrode of the fifteenth transistor is connected to the second node, a first electrode of the fifteenth transistor is connected to a fourth clock signal terminal to receive a fourth clock signal, a second electrode of the fifteenth transistor is connected to the shift output terminal, a gate electrode of the sixteenth transistor is connected to the second node, a first electrode of the sixteenth transistor is connected to the fourth clock signal terminal to receive the fourth clock signal, a second electrode of the sixteenth transistor is connected to the first scan signal output terminal, a gate electrode of the seventeenth transistor is connected to the second node, a first electrode of the seventeenth transistor is connected to a fifth clock signal terminal to receive a fifth clock signal, a second electrode of the seventeenth transistor is connected to the second scan signal output terminal, and a first terminal of the second capacitor is connected to the second node, and a second terminal of the second capacitor is connected to the shift output terminal;

the second input circuit comprises a charging sub-circuit, a storage sub-circuit, and an isolation sub-circuit;

the charging sub-circuit comprises an eighteenth transistor, a gate electrode of the eighteenth transistor is connected to a sixth clock signal terminal to receive a sixth clock signal, a first electrode of the eighteenth transistor is connected to a blanking control terminal to receive a second control signal, and a second electrode of the eighteenth transistor is connected to a blanking node;

the storage sub-circuit comprises a third capacitor, a first terminal of the third capacitor is connected to the blanking node, and a second terminal of the third capacitor is connected to the second voltage terminal to receive the second voltage;

the isolation sub-circuit comprises a nineteenth transistor and a twentieth transistor, a gate electrode of the nineteenth transistor is connected to the blanking node, a first electrode of the nineteenth transistor is connected to an eighth clock signal terminal to receive an eighth clock signal as a second input signal, a second electrode of the nineteenth transistor is connected to a first electrode of the twentieth transistor, a gate electrode of the twentieth transistor is connected to a seventh clock signal terminal to receive a seventh clock signal, and a second electrode of the twentieth transistor is connected to the first node;

the display reset circuit comprises a twenty-first transistor, a gate electrode of the twenty-first transistor is connected to a display reset terminal to receive a display reset signal, a first electrode of the twenty-first transistor is connected to the first node, and a second electrode of the twenty-first transistor is connected to the second voltage terminal to receive the second voltage; and the blanking reset circuit comprises a twenty-second transistor, a gate electrode of the twenty-second transistor is connected to the sixth clock signal terminal to receive the sixth clock signal as a blanking reset signal, a first electrode of the twenty-second transistor is connected to the first node, and a second electrode of the twenty-second transistor is connected to the second voltage terminal to receive the second voltage.

14. A gate driving circuit, comprising a plurality of cascaded shift register units according to claim 1;
a display control terminal of an (n+2)-th stage of shift register unit is connected to a shift output terminal of an n-th stage of shift register unit; and
a blanking control terminal of an (n+1)-th stage of shift register unit is connected to the shift output terminal of the n-th stage of shift register unit, and n is an integer greater than zero.

15. A display device, comprising the gate driving circuit according to claim 14.

16. A driving method for driving the shift register unit according to claim 1, comprising:
in a first phase, in response to the first control signal, inputting the first input signal to the first node through the first input circuit;
in a second phase, outputting the output control signal to the second node under control of the level of the first node; and in a third phase, outputting the output signal to the output terminal under control of the level of the second node.

\* \* \* \* \*